United States Patent
Jeon et al.

(10) Patent No.: US 8,294,209 B2
(45) Date of Patent: Oct. 23, 2012

(54) SEMICONDUCTOR MEMORY DEVICE AND METHOD OF MANUFACTURING THE SAME

(75) Inventors: Sanghun Jeon, Yongin-si (KR); Jongwook Lee, Yongin-si (KR); Jong-Hyuk Kang, Suwon-si (KR); Heungkyu Park, Gumi-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 341 days.

(21) Appl. No.: 12/659,076

(22) Filed: Feb. 24, 2010

(65) Prior Publication Data

US 2010/0213524 A1    Aug. 26, 2010

(30) Foreign Application Priority Data

Feb. 26, 2009    (KR) ........................ 10-2009-0016419

(51) Int. Cl.
   *H01L 29/94*    (2006.01)
(52) U.S. Cl. .. 257/330; 257/328; 257/332; 257/E29.001
(58) Field of Classification Search .................. 257/330, 257/328, 332, E29.001, 314–316
   See application file for complete search history.

(56) References Cited

U.S. PATENT DOCUMENTS 6,316,317 B1    11/2001    Kawata et al.
2003/0155607 A1    8/2003    Kamigaki et al.
2005/0051806 A1*    3/2005    Masuoka et al. .............. 257/222
2006/0244043 A1    11/2006    Wang et al.

FOREIGN PATENT DOCUMENTS

JP    2000-269361 A    9/2000
JP    2005-085938 A    3/2005

OTHER PUBLICATIONS

Arimoto, Kazutami, et al., "A High-Density Scalable Twin Transistor RAM (TTRAM) with Verify Control for SOI Platform Memory IPs", IEEE Journal of Solid-State Circuits, Vo. 42, No. 11, pp. 2611-2619, (Nov. 2007).

Morishita, Fukashi, et al., "A Capacitorless Twin-Transistor Random Access Memory (TTRAM) on SOI", IEEE 2005 Custom Integrated Circuits Conference, pp. 435-438, (2005).

* cited by examiner

*Primary Examiner* — Jack Chen
(74) *Attorney, Agent, or Firm* — Lee & Morse, P.C.

(57) ABSTRACT

A semiconductor memory device includes a plurality of active pillars protruding from a semiconductor substrate, a first gate electrode disposed on at least one sidewall of the active pillar, a first gate insulating layer being disposed between the active pillar and the first gate electrode, a second gate electrode disposed on at least one sidewall of the active pillar over the first gate electrode, a second gate insulating layer being disposed between the active pillar and the second gate electrode, first and second body regions in the active pillar adjacent to respective first and second respective electrodes, and first through third source/drain regions in the active pillar arranged alternately with the first and second body regions.

14 Claims, 26 Drawing Sheets

SEMICONDUCTOR MEMORY DEVICE AND METHOD OF MANUFACTURING THE SAME

BACKGROUND

1. Field

The present disclosure relates to semiconductor memory devices and methods of manufacturing the same.

2. Description of the Related Art

Generally, a dynamic random access memory (DRAM) device may include a field effect transistor controlling a read/write operation and a capacitor storing a charge. A high integration of a DRAM device has been continuously improved by miniaturization of the field effect transistor and a process technology, e.g., a technology for forming a stack capacitor or a deep trench capacitor, for obtaining an effective capacitance of the capacitor in a small area. However, miniaturization of the field effect transistor may cause a short channel effect in the DRAM device, and the process technology for forming the capacitor with an effective capacitance in a small area may be complex and increase production costs.

SUMMARY

Embodiments are therefore directed to a semiconductor memory device and a method of manufacturing the same, which substantially overcome one or more of the problems due to the limitations and disadvantages of the related art.

It is therefore a feature of an embodiment to provide a semiconductor memory device with a vertical active pillar surrounded by vertically arranged gate electrodes on sidewalls of the active pillar in order to improve high density integration of the semiconductor memory device.

It is therefore another feature of an embodiment to provide a method of manufacturing a semiconductor memory device with a vertical active pillar surrounded by vertically arranged gate electrodes on sidewalls of the active pillar.

At least one of the above and other features and advantages may be realized by providing a semiconductor memory device, including a plurality of active pillars protruding from a semiconductor substrate, a first gate electrode disposed on one side of the active pillar, a first gate insulating layer being disposed between the active pillar and the first gate electrode, a second gate electrode disposed on one side of the active pillar over the first gate electrode, a second gate insulating layer being disposed between the active pillar and the second gate electrode, a first body region formed at the active pillar adjacent to the first gate electrode, a second body region formed at the active pillar adjacent to the second gate electrode, a first source/drain region formed between the first body region and the semiconductor substrate in the active pillar, a second source/drain region formed between the second body region and the first body region in the active pillar, and a third source/drain region formed on the second body region in the active pillar.

Each of the first gate electrode and the second gate electrode may surround the active pillars and extend in a first direction orthogonal to a sidewall of the active pillar to have a trapezoid shape. Each of the first and second gate electrodes may continuously overlap an entire perimeter of each active pillar. Each of the first and second gate electrodes may surround more than half a perimeter of respective active pillars, the first and second gate electrodes overlapping each other and are separated from each other by an insulator along a vertical direction. Each of the first and second gate electrodes may surround at least three sidewalls of respective active pillars, the first and second gate electrodes surrounding respective first and second body regions in the active pillars. Charges may be accumulated in the first body region or the second body region.

The semiconductor memory device may further include a device isolation layer of a line shape formed in the semiconductor substrate and extending in a second direction, and an impurity-doped region formed in the semiconductor substrate adjacent to the device isolation layer, wherein the active pillar may be adjacent to the semiconductor substrate of the impurity-doped region and the impurity-doped region may be doped with an impurity having the same type as the first source/drain region.

At least one of the above and other features and advantages may also be realized by providing a method of manufacturing a semiconductor memory device, including sequentially stacking a first insulating layer, a first sacrificial layer, a second insulating layer, a second sacrificial layer and a third insulating layer on a semiconductor substrate, forming an active pillars penetrating the third insulating layer, the second sacrificial layer, the second insulating layer, the first sacrificial layer and the first insulating layer to be in contact with the semiconductor substrate, forming a first groove exposing the first sacrificial layer and running in a first direction by patterning the third insulating layer, the second sacrificial layer and the second insulating layer, exposing a sidewall of the active pillars by removing the first sacrificial layer and the second sacrificial layer through the first groove, forming a gate insulating layer on a sidewall of the exposed active pillar, forming a conductive layer filling the first groove and a region where the first sacrificial layer and the second sacrificial layer are removed, forming a second groove exposing sidewalls of the second and third insulating layers and a top surface of the first insulating layer by patterning the conductive layer in a position superposed on the first groove, and forming an insulating line filling the second groove.

The method may further include forming a device isolation layer of a line shape extending in a second direction at the semiconductor substrate, and forming an impurity-doped region in the semiconductor substrate adjacent to the device isolation layer, wherein the active pillar is formed to be in contact with the semiconductor substrate of the impurity-doped region.

The method may further include forming a first body region in the active pillar adjacent to the first sacrificial layer, forming a second body region in the active pillar adjacent to the second sacrificial layer, forming a first source/drain region in the active pillar adjacent to a first insulating layer, forming a second source/drain region in the active pillar adjacent to a second insulating layer, and forming a third source/drain region in the active pillar adjacent to a third insulating layer.

The active pillar may be formed of an epitaxial semiconductor layer by a selective epitaxial growth (SEG) method, and an impurity may be injected by an in-situ doping method to form a first body region, a second body region, a first source/drain region, a second source/drain region and a third source/drain region while the active pillar is formed.

The method may further include forming an insulating pattern which is in contact with the semiconductor substrate and a side of the active pillar by sequentially penetrating the third insulating layer, the second sacrificial layer, the second insulating layer, the first sacrificial layer and the first insulating layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
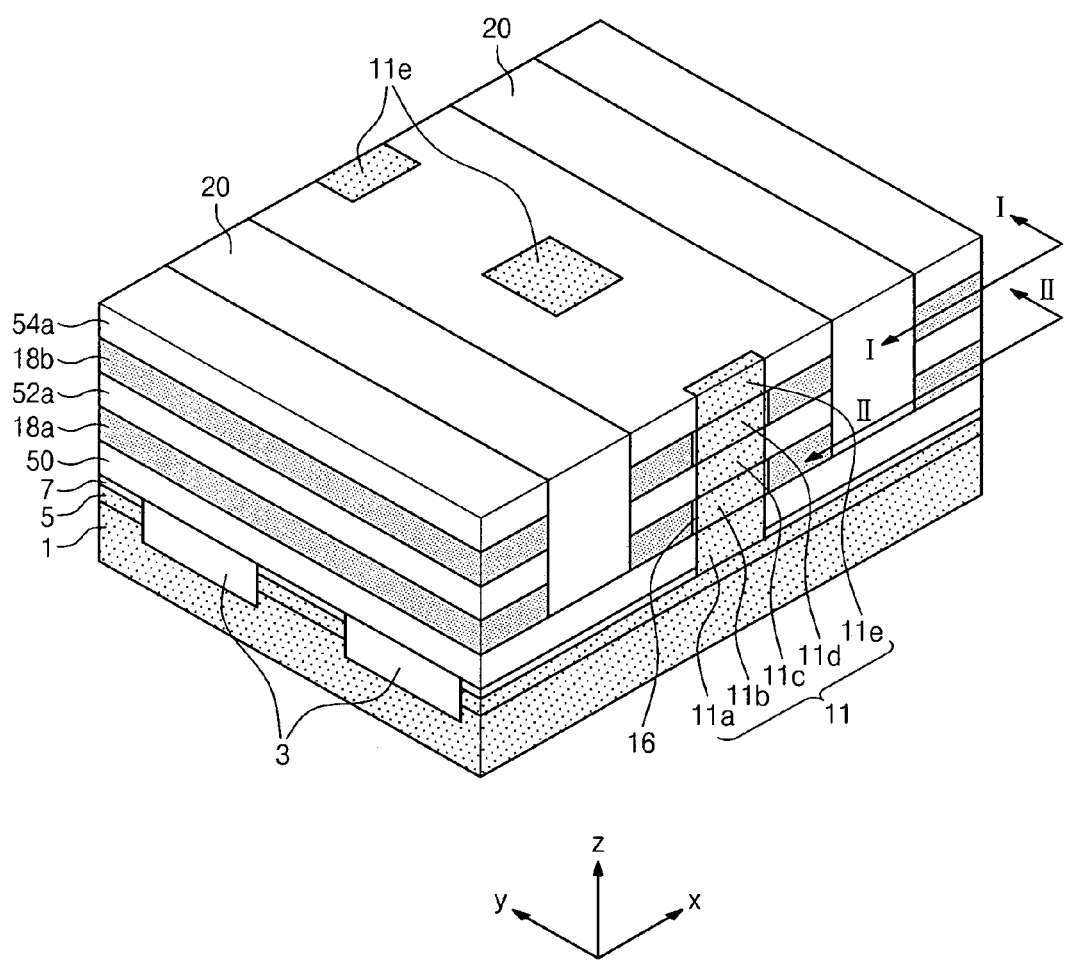
FIG. 1 illustrates a semiconductor memory device in accordance with an example embodiment.

Korean Patent Application No. 10-2009-0016419, filed on Feb. 26, 2009, in the Korean Intellectual Property Office, and entitled: "Semiconductor Memory Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

First Embodiment

Figure 2:
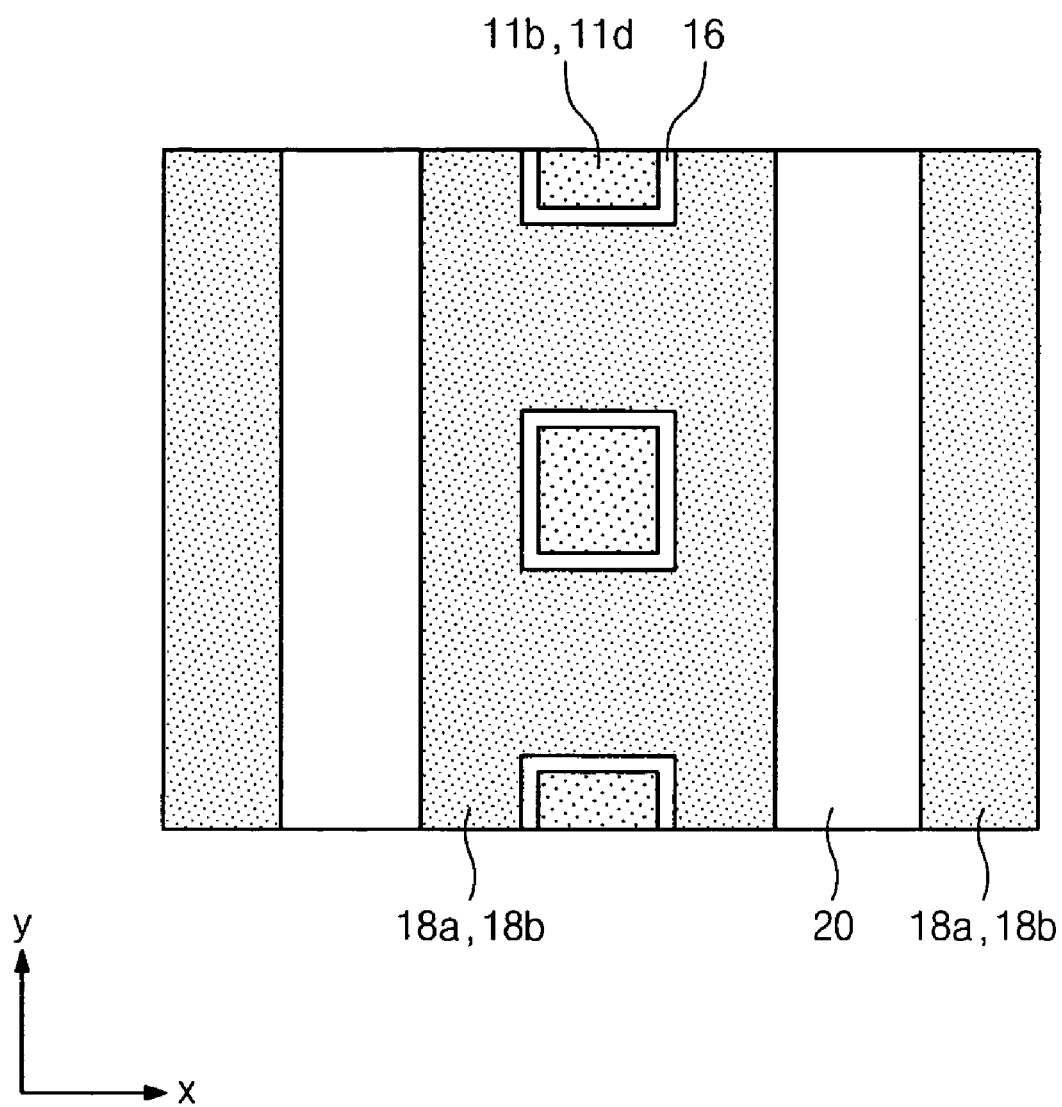
FIG. 2 illustrates a top plan view along line I-I or II-II of FIG. 1.

FIG. 1 illustrates a perspective view of a semiconductor memory device in accordance with an example embodiment. FIG. 2 illustrates a top plan view along line I-I or II-II of FIG. 1.

Referring to FIGS. 1 and 2, in a semiconductor memory device in accordance with an embodiment, a semiconductor substrate 1 may have a top plan in first and second directions x and y, e.g., the first and a second directions x and y may be orthogonal to each other. That is, a top surface of the semiconductor substrate 1 may be positioned in the xy-plane, as illustrated in FIG. 1. A plurality of device isolation layers 3 may extend in the first direction x in the semiconductor substrate 1. An impurity-doped region 5 may be formed in the semiconductor substrate 1 adjacent to the device isolation layer 3, e.g., between two adjacent device isolation layers 3. An active pillar 11 may protrude from a predetermined region of the semiconductor substrate 1, e.g., the active pillar 11 may be on the impurity-doped region 5. That is, the active pillar 11 may be a linear structure extending vertically in a third direction z, i.e., a direction orthogonal to the first and second directions x and y.

The active pillar 11 may include a first source/drain region 11a, a first body region 11b, a second source/drain region 11c, a second body region 11d, and a third source/drain region 11e sequentially stacked on the semiconductor substrate 1, e.g., directly on the impurity-doped region 5. In other words, the first body region 11b may be vertically arranged between, e.g., directly between, the first and second source/drain regions 11a and 11c, and the second body region 11d may be vertically arranged between, e.g., directly between, the second and third source/drain regions 11c and 11e. For example, the active pillar 11 may have a quadrangular shape, e.g., a square, when viewed from a plan view, so each of the first and second body regions 11b and 11d, as well as each of the first through third source/drain regions 11a through 11c, may have a quadrangular shape when viewed form a plan view, as illustrated in FIG. 2. For example, the first and second body regions 11b and 11d, as well as the source/drain regions 11a, 11c, and 11e, may overlap, e.g., completely overlap, each other, as illustrated in FIG. 2, so respective sidewalls thereof may be aligned, e.g., may be coplanar. That is, the active pillar 11 may have substantially flat sidewalls, e.g., substantially orthogonal to the top surface of the semiconductor substrate 1, as illustrated in FIG. 1. An impurity of a p-type may be doped in the first body region 11b and the second body region 11d. An impurity of an n-type may be doped in the impurity-doped region 5 and the source/drain regions 11a, 11c, and 11e. For example, as illustrated in FIGS. 1-2, the semiconductor memory device in accordance with an embodiment may include a plurality of pillars 11 spaced apart from each other along the second direction y.

As illustrated in FIG. 2, sidewalls of the first body region 11b may be surrounded with a first gate electrode 18a, e.g., the first gate electrode 18a may completely surround four sides along a perimeter of the first body region 11b, and a gate insulating layer 16 may be disposed between the first body region 11b and the first gate electrode 18a. Similarly, as further illustrated in FIG. 2, sidewalls of the second body region 11d may be surrounded with a second gate electrode 18b, and the gate insulating layer 16 may be disposed between the second body region 11d and the second gate electrode 18b. For example, top and bottom surfaces of each of the first and second gate electrodes 18a and 18b may be coplanar with respective top and bottom surfaces of respective ones of the first and second body regions 11b and 11d. The first and second gate electrodes 18a and 18b may have a quadrangular shape, e.g., trapezoid or rectangular, surrounding the body regions 11b and 11d along the second direction y. For example, the first and second gate electrodes 18a and 18b may have frame structures to surround respective first and second body regions 11b and 11d. For example, the first and second gate electrodes 18a and 18b may have a substantially same shape, and may completely overlap each other. When an entire perimeter, e.g., all sidewalls, of the first and second body regions 11b and 11d is surrounded, e.g., conformally, with the gate electrodes 18a and 18b, a channel area may be maximized and the amount of current may be increased. Therefore, when a unit memory cell is operated in the semiconductor device in accordance with an embodiment, an excess hole or electron may not go out of the first body region 11b or the second body region 11d to be temporarily stored in a center of the first body region 11b or the second body region 11d.

As further illustrated in FIG. 1, a first insulating layer 50 for insulating the first gate electrode 18a from the semiconductor substrate 1 may be disposed between the first gate electrode 18a and the semiconductor substrate 1. A second insulating layer 52a for insulating the first gate electrode 18a from the second gate electrode 18b may be disposed between the first gate electrode 18a and the second gate electrode 18b. A third insulating layer 54a may be disposed on the second gate electrode 18b, i.e., the second gate electrode 18b may be disposed between the second and third insulating layers 52a and 54a. As further illustrated in FIGS. 1-2, the first gate electrode 18a and the adjacent first gate electrode 18a, and the second gate electrode 18b and the adjacent second gate electrode 18b may be divided by an insulating line 20 extending in the second direction y. For example, the insulating line 20 may extend along the second direction y, and may protrude vertically along the third direction z to divide each of the first and second gate electrodes 18a and 18b into a plurality of portions, e.g., into two portions, on each side of the active pillar 11a.

A first well region in which an impurity of a type opposite to the impurity of the impurity-doped region 5 may be formed in the semiconductor substrate 1 under the impurity-doped region 5. The first well region may be surrounded by at least one second well region (not illustrated) having a conductivity type different from the first well region, thereby making it possible to constitute a double pocket well structure or a triple pocket well structure.

The active pillar 11 may be an epitaxial semiconductor layer. The active pillar 11 may have a crystalline structure aligned with a semiconductor crystalline structure of the semiconductor substrate 1.

In the semiconductor memory device in accordance with the present embodiment, high integration may be improved by using the active pillar 11 as an active region, which protrudes vertically from the semiconductor substrate 1, and disposing vertically arranged gate electrodes 18a and 18b on sidewalls of the active pillar 11. Also, a problem of a short channel effect may be improved by controlling a vertical thickness of the gate electrodes 18a and 18b. Further, the semiconductor memory device may have reduced manufacturing costs by forming the active pillar 11 without using SOI substrate which is very expensive.

Figure 3:
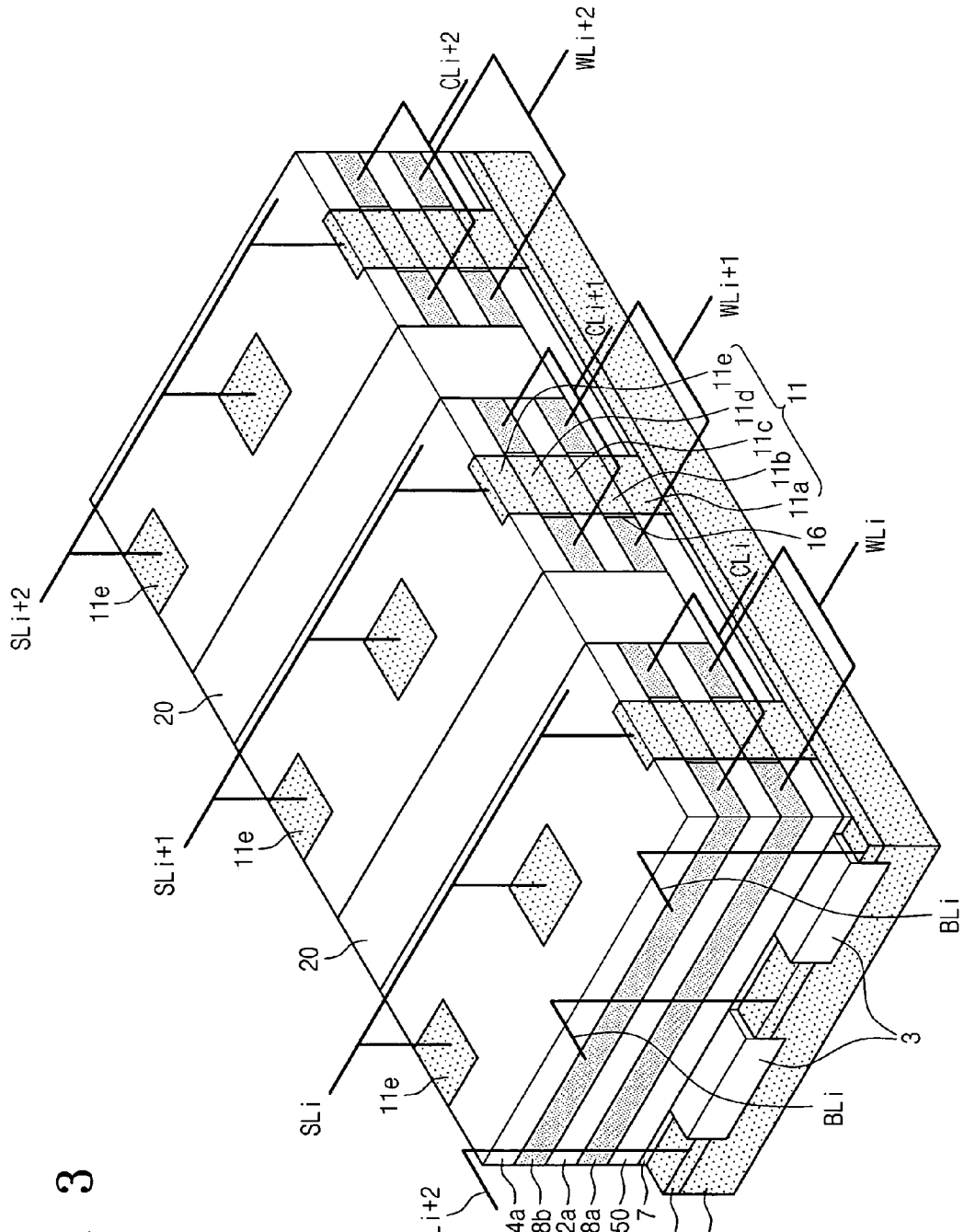
FIG. 3 illustrates lines additionally connected to the semiconductor memory device of FIG. 1.

FIG. 3 illustrates lines additionally connected to the semiconductor memory device of FIG. 1.

Figure 4:
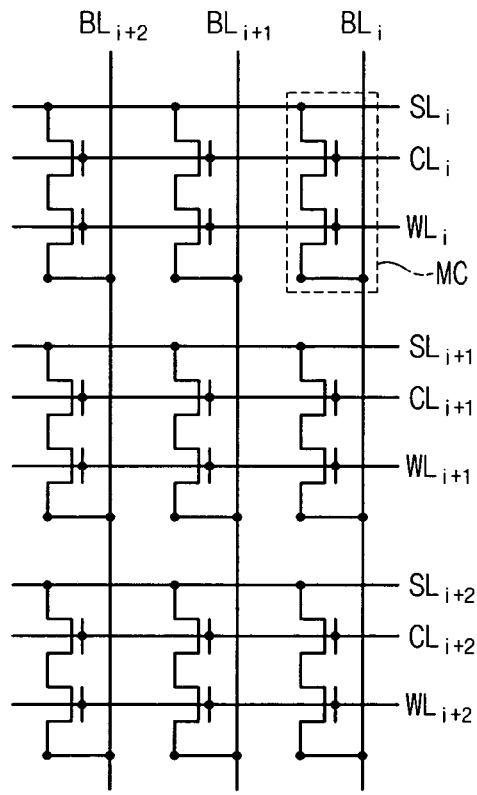
FIG. 4 illustrates a circuit diagram of the semiconductor memory device of FIG. 1.

Referring to FIG. 3, the third source/drain region 11e may be electrically connected to select lines SL, i.e., source lines SL, extending in the same direction as the first and second gate electrodes 18a and 18b. It is noted that "i" in the figure indicates sequence of lines, i.e., i, i+1, i+2, . . . etc. The first gate electrode 18a may be referred to as, e.g., connected to, a word line WL. The impurity-doped region 5, which is formed in the semiconductor substrate 1 adjacent to the device isolation layer 3 and is in contact with the first source/drain region 11a, may be referred to as, e.g., connected to, a bit line BL. A circuit diagram of the semiconductor memory device is illustrated in FIG. 4. A circuit diagram of one unit memory cell of the semiconductor memory device in FIG. 4 is illustrated in FIG. 5.

Figure 5:
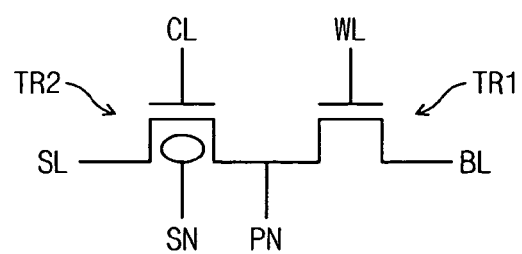
FIG. 5 illustrates a unit memory cell of the circuit of FIG. 4.

Referring to FIGS. 3-5, the bit line BL may correspond to the impurity-doped region 5 and the first source/drain region 11a, and the word line WL may correspond to the first gate electrode 18a. A purge node PN may correspond to the second source/drain region 11c, and a storage node SN may correspond to the second body 11d. A charge line CL may correspond to the second gate electrode 18b, and a select line SL may correspond to the third source/drain region 11e. The first source/drain region 11a, the first body region 11b, the second source/drain region 11c, and the first gate electrode 18a may constitute a first transistor TR1, e.g., an access transistor. The second source/drain region 11c, the second body region 11d, the third source/drain region 11e, and the second gate electrode 18b may constitute a second transistor TR2, e.g., a storage transistor.

An operation process of a semiconductor memory device where the first transistor and the second transistor are connected to each other to form a unit memory cell is described with reference to FIG. 5.

Referring to FIG. 5, when writing data '0', the bit line BL and the word line WL are set to 0 V and ½ VDD, respectively. VDD is applied to the charge line CL and the select line SL. Although the charge line voltage becomes VDD, a channel is formed in the second body region 11d, so a potential of the second body region 11d of the second transistor TR2 does not rise.

When writing data '1', the bit line BL and the word line WL are set to ½ VDD. Under that state, the first transistor TR1 is in "off" state, thereby floating the purge node PN. While the charge line CL becomes 0 V, and VDD is applied to the select line SL, holes are injected into the storage node SN by GIDL (gate-induced drain leakage) current from the select line SL. If the charge line CL becomes VDD, two floating nodes (SN and PN) rise to a value near VDD by a capacitor coupling.

Two storage states may be embodied by the method described above. When data '1' is stored in the storage node SN, a threshold voltage of the second transistor TR2 decreases, and when data '0' is stored in the storage node SN, a threshold voltage of the second transistor TR2 increases. The second transistor TR2 performs the same function as a capacitor, and charges stored in the storage node SNk may be detected through the bit line BL by turn-on of the first transistor TR1. A difference between the two states may be detected by detecting charges stored in the storage node SN.

FIGS. 6 through 14 illustrate perspective views of stages in a process of forming the semiconductor memory device of FIG. 1.

Figure 6:
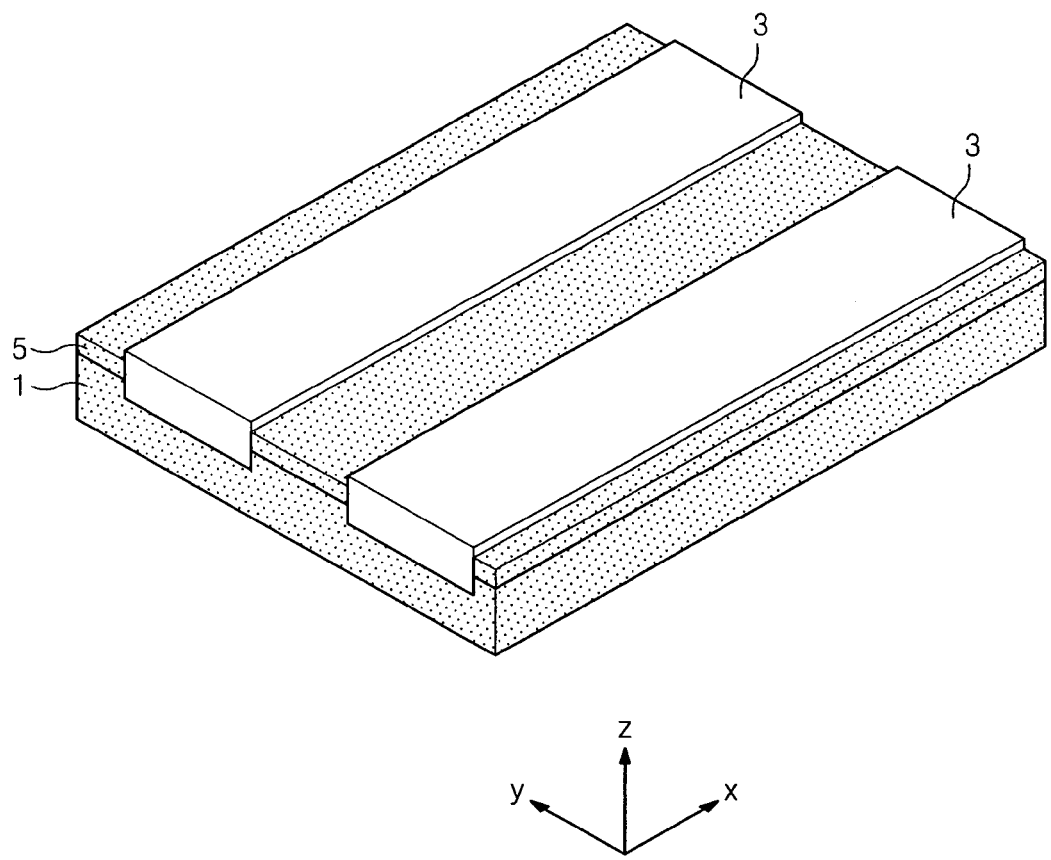
FIGS. 6 through 14 illustrate perspective views of stages in a process of forming the semiconductor memory device of FIG. 1.

Referring to FIG. 6, the semiconductor substrate 1 may be prepared. An impurity, e.g., P-type impurity, may be doped in an entire surface of the semiconductor substrate 1 to form a well region. The device isolation layer 3, e.g., having a line shape extending along the first direction x, may be formed in the semiconductor substrate 1. The device isolating layer 3 may be formed, e.g., by a full trench isolation (FTI) method or a shallow trench isolation (STI) method. The impurity-doped region 5 may be formed in the semiconductor substrate 1 adjacent to the device isolation layer 3, e.g., by an ion implantation process. The impurity-doped region 5 may be formed by doping, e.g., N-type impurity. Since the impurity-doped region 5 is formed in an active region defined by the device isolation layer 3, it may have an impurity distribution region of a line shape along the first direction x.

Figure 7:
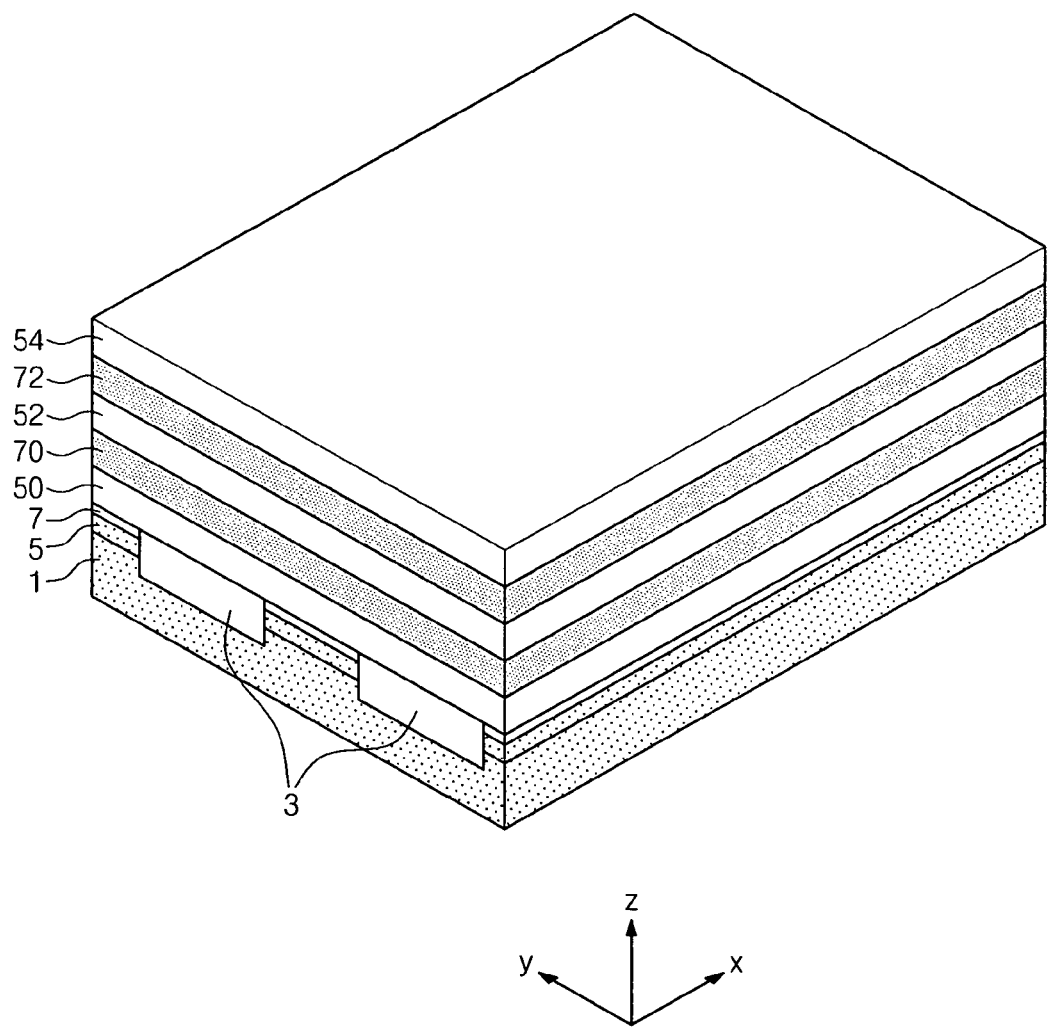

Referring to FIG. 7, a gate insulating layer 7 of a peripheral circuit may be formed on the semiconductor substrate 1. The gate insulating layer 7 of a peripheral circuit may be formed to form a peripheral circuit transistor, e.g., the gate insulating layer 7 may not be formed only in a cell memory region. The first insulating layer 50, a first sacrificial layer 70, a second insulating layer 52, a second sacrificial layer 72, and a third insulating layer 54 may be sequentially stacked on the semiconductor substrate 1. The first and second sacrificial layers 70 and 72 may have an etching selectivity with respect to the first, second, and third insulating layers 50, 52, and 54. For example, if the first, second, and third insulating layers 50, 52, and 54 are formed of a silicon oxide layer system, the first and second sacrificial layers 70 and 72 may be formed of a silicon nitride layer, a silicon germanium layer, or a tungsten layer. Thicknesses of the first and second sacrificial layers 70 and 72 may be determined by considering a thickness of a gate electrode and a length of a channel subsequently to be formed.

Figure 8:
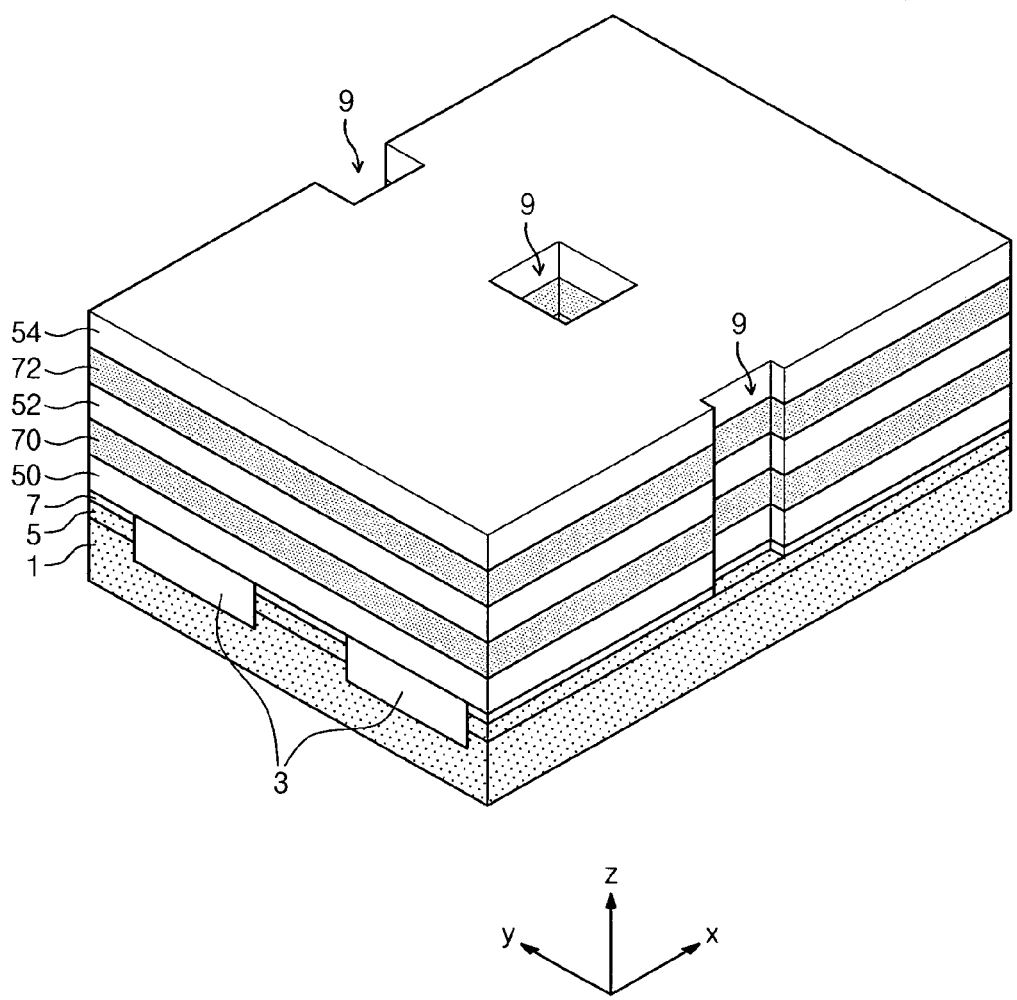

Referring to FIG. 8, the third insulating layer 54, the second sacrificial layer 72, the second insulating layer 52, the first sacrificial layer 70, the first insulating layer 50, and the gate insulating layer 7 may be sequentially patterned to form a pillar hole 9 exposing the impurity-doped region 5 of the semiconductor substrate 1. The pillar hole 9 may have any suitable shape, e.g., a square hole.

Figure 9:
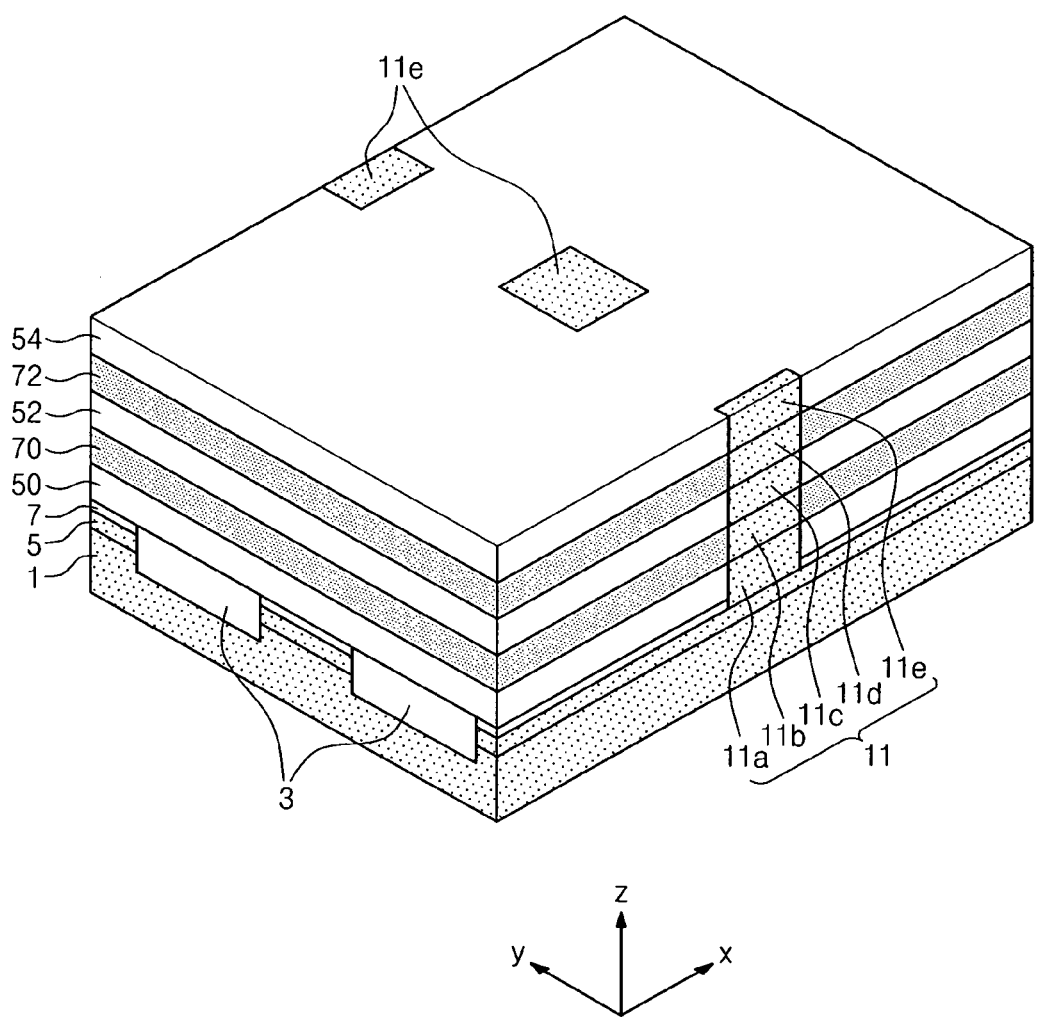

Referring to FIG. 9, the active pillar 11 may be formed in the pillar hole 9. For example, the active pillar 11 may be formed of an epitaxial semiconductor layer, e.g., by a solid phase epitaxy (SPE) method, a metal-induced crystallization (MIC) method, a laser-induced epitaxial growth (LEG) method, or a metal-induced lateral crystallization (MILC) method. When the epitaxial semiconductor layer is formed by one of the methods described above, the epitaxial semiconductor layer on the third insulating layer 54 may be removed by an etch-back process or a chemical mechanical polishing (CMP) process. After forming the epitaxial semiconductor layer, an ion implantation process may be performed on the active pillar 11 several times to form first, second, and third source/drain regions 11a, 11c, and 11e, as well as first and second body regions 11b and 11d. In another example, the active pillar 11 may be formed of an epitaxial semiconductor layer by a selective epitaxial growth (SEG) method. When the epitaxial semiconductor layer is formed by the SEG method, an impurity may be implanted using in-situ doping to form the first, second, and third source/drain regions 11a, 11c, and 11e, as well as the first and second body regions 11b and 11d. The first, second, and third source/drain regions 11a, 11c, and 11e may be doped, e.g., with an impurity of N-type. The first and second body regions 11b and 11d may be doped, e.g., with an impurity of P-type.

Figure 10:
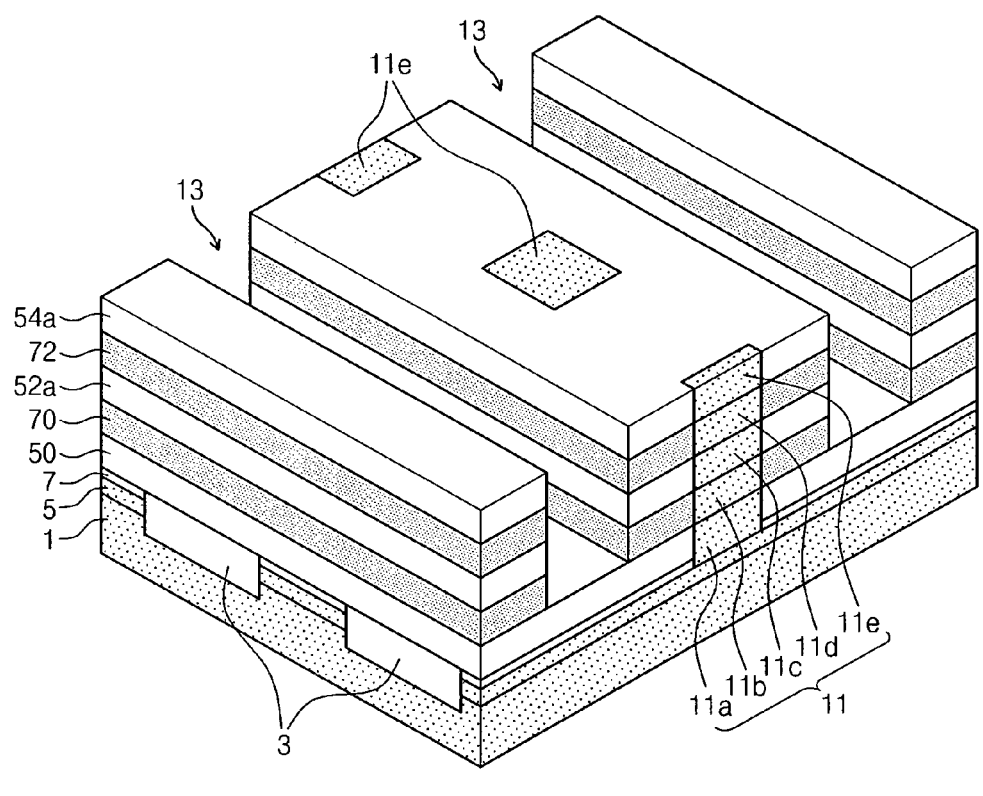

Referring to FIG. 10, the third insulating layer 54, the second sacrificial layer 72, and the second insulating layer 52 may be successively patterned to have a line shape in regions spaced apart from the active pillar 11 to form a first groove 13 exposing the first insulating layer 50. When forming the first groove 13, the first sacrificial layer 70 may also be etched to expose a top surface of the first insulating layer 50. As a result, the third insulating layer 54 and the second insulating layer 52 may become the third insulating layer pattern 54a and the second insulating layer pattern 52a, respectively, having a quadrangular shape surrounding the active pillar 11 and running in the second direction y.

Figure 11:
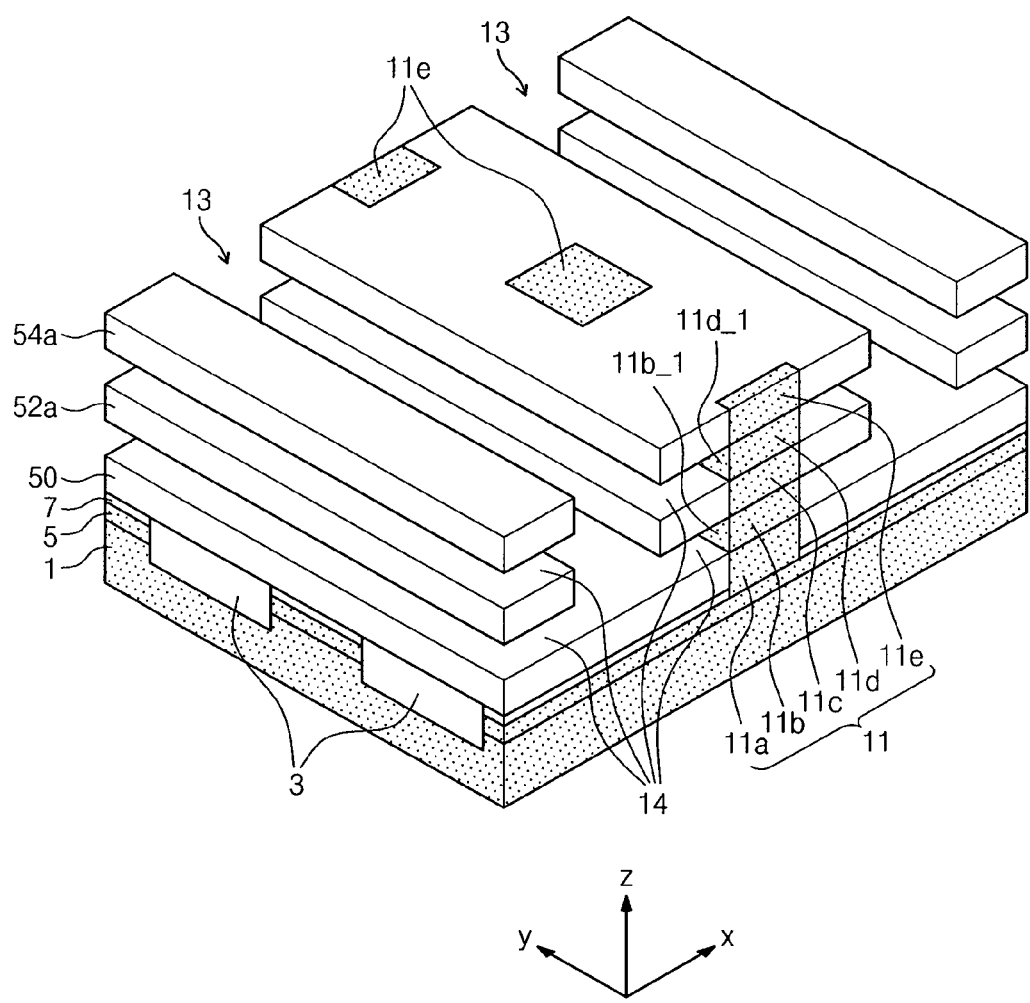

Referring to FIG. 11, the second sacrificial layer 72 and the first sacrificial layer 70, which may be exposed by the first groove 13, may be removed to form an exposed region 14. The second sacrificial layer 72 and the first sacrificial layer 70 may be removed by a wet etching using an etching solution having an etching selectivity with respect to the insulating layer patterns 54a and 52a. For example, if the insulating layer patterns 54a and 52a include silicon oxide, and the second sacrificial layer 72 and the first sacrificial layer 70 include silicon nitride, the insulating layer patterns 54a and 52a may be removed using phosphoric acid. If the insulating layer patterns 54a and 52a include silicon oxide, and the second sacrificial layer 72 and the first sacrificial layer 70 include tungsten or silicon germanium, the insulating layer patterns 54a and 52a may be removed using a mixture solution of ammonium hydroxide, peroxide, and water. Since the first and second sacrificial layers 70 and 72 are removed to form the exposed region 14, sidewalls 11b_1 and 11d_1 of the first and second body regions 11b and 11d of the active pillar 11 may be exposed by the exposed region 14.

Figure 12:
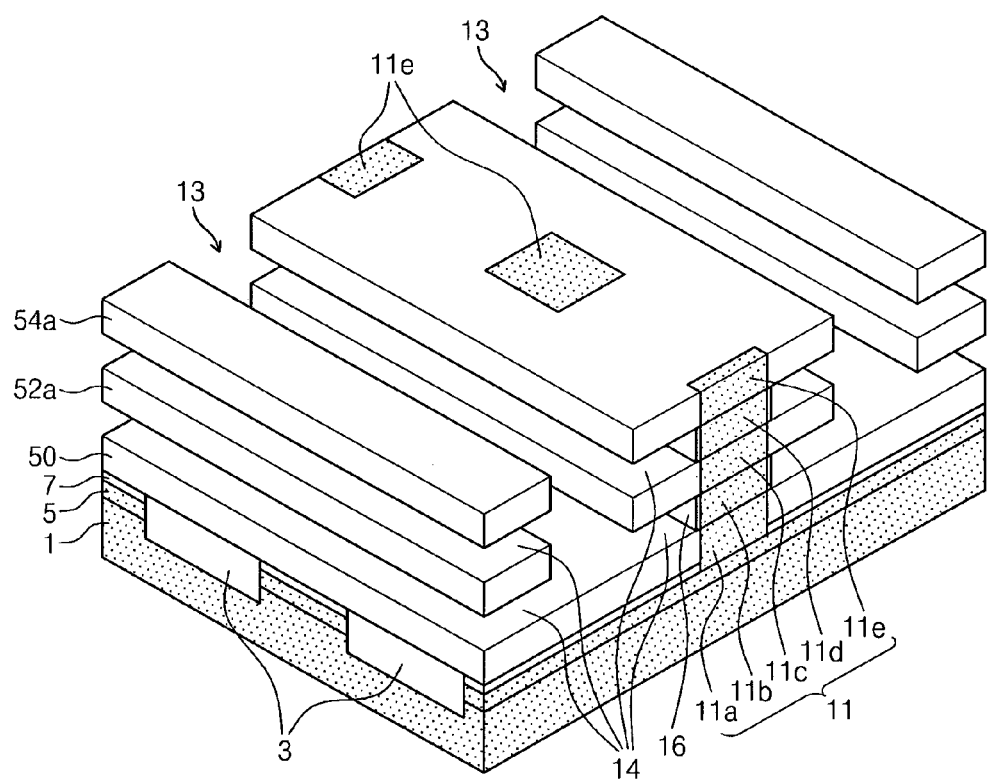

Referring to FIG. 12, the gate insulating layer 16 may be formed on the sidewalls 11b_1 and 11d_1 of the first and second body regions 11b and 11d of the active pillar 11. For example, the semiconductor substrate 1 with the structures thereon, i.e., with the first and second body regions 11b and 11d, may be loaded in a chamber of an oxidation atmosphere including oxygen to form the gate insulating layer 16, e.g., a thermal oxidation layer, on the exposed sidewalls of the first and second body regions 11b and 11d.

Figure 13:
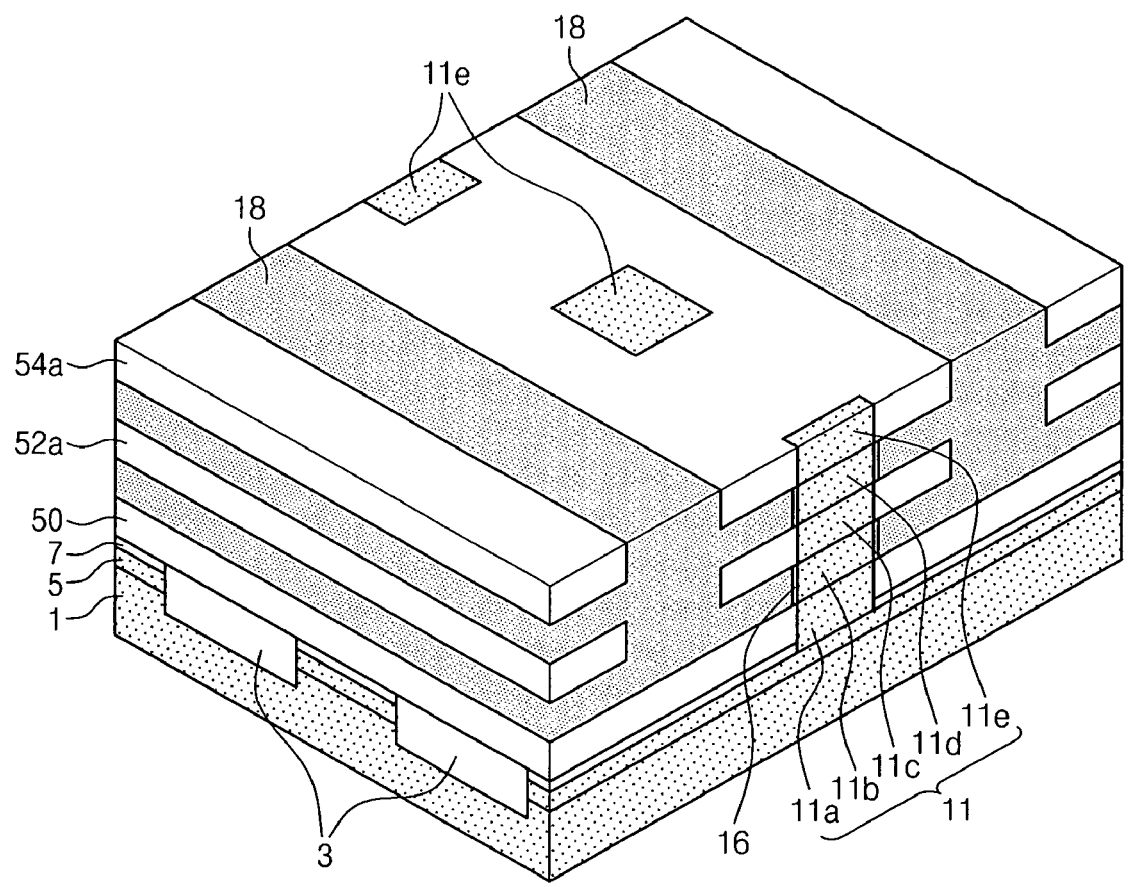

Referring to FIG. 13, a gate layer 18 may be formed in the exposed region 14 on a front side of the semiconductor substrate 1. For example, the gate layer 18 may completely fill the exposed region 14 and the first groove 13 to contact, e.g., directly contact, the gate insulating layer 16, the first insulating layer 50, and the insulating layer patterns 54a and 52a. The gate layer 18 may be formed of at least one of metal, metal silicide, and polysilicon in which an impurity may be doped or not. The gate layer 18 may be formed by a chemical vapor deposition (CVD) or an atomic layer deposition (ALD) having a good step coverage characteristic. The gate layer 18 may be formed to fill the first groove 13 and the exposed region 14, and may further be formed on the third insulating layer pattern 54a, e.g., to cover at least 3 surfaces of the third insulating layer pattern 54a. If the gate layer 18 is formed on the third insulating layer pattern 54a, a portion of the gate layer 18 may be removed by an anisotropic etch-back process or a chemical mechanical polishing (CMP) process to expose the third source/drain region 11e.

Figure 14:
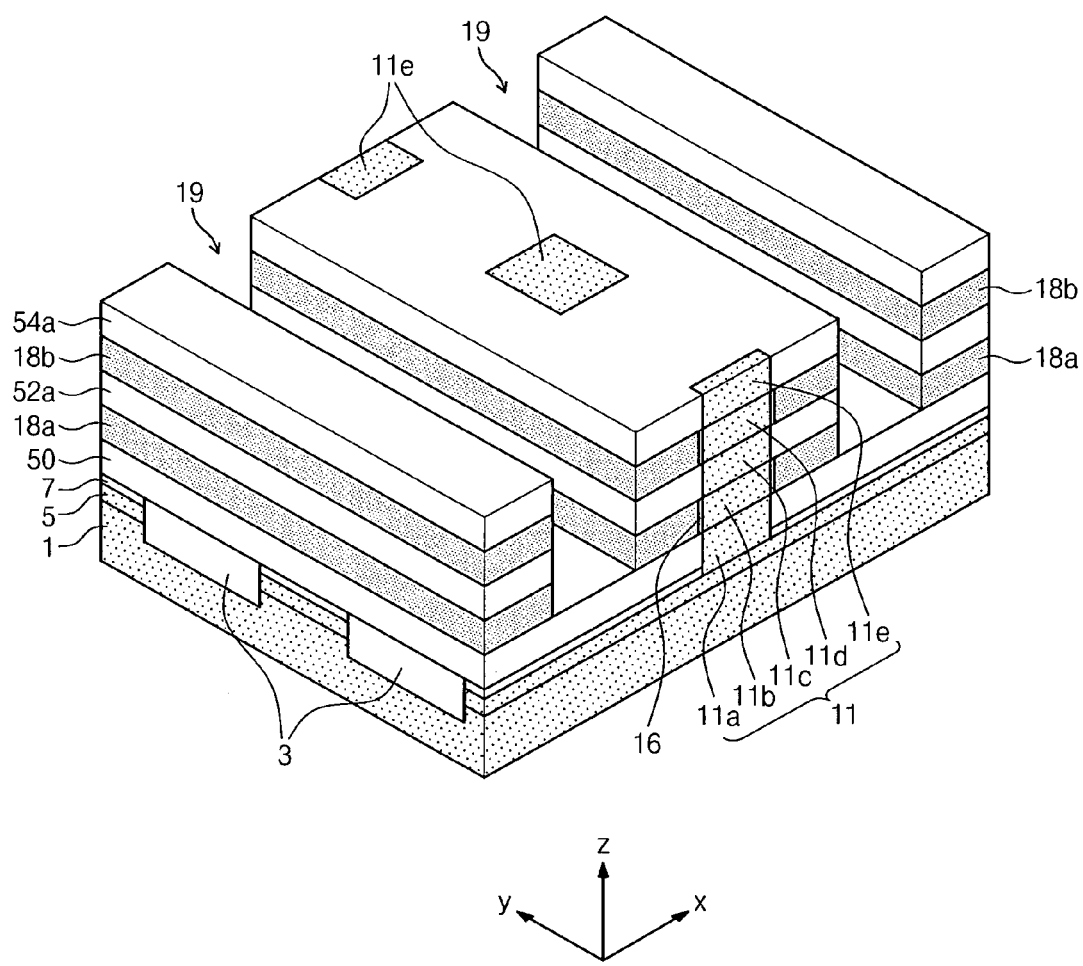

Referring to FIG. 14, the gate layer 18 may be patterned at a position superimposed on the first groove 13 to form a second groove 19 exposing the first insulating layer 50. That is, a portion of the gate layer 18 may be removed from the first groove 13 to define the second groove 19 exposing the first insulating layer 50. As a result, first and second gate patterns 18a and 18b superimposed on the third and second insulating layer patterns 54a and 52a and having the same shape as the third and second insulating layer patterns 54a and 52a may be formed. For example, as illustrated in FIG. 14, the first gate pattern 18a, the second insulating layer pattern 52a, the second gate pattern 18b, and the third insulating layer patter 54a may be sequentially arranged on, e.g., directly on, the first insulating layer 50, and may overlap, e.g., completely overlap, each other.

Referring back to FIG. 1, the insulating line 20 may be formed in the second groove 19. More specifically, an insulating layer may be formed on an entire surface of the semiconductor substrate 1, and then a planarization process may be performed to simultaneously expose a top surface of the active pillar 11 and form the insulating line 20 in the second groove 19.

Second Embodiment

Figure 15:
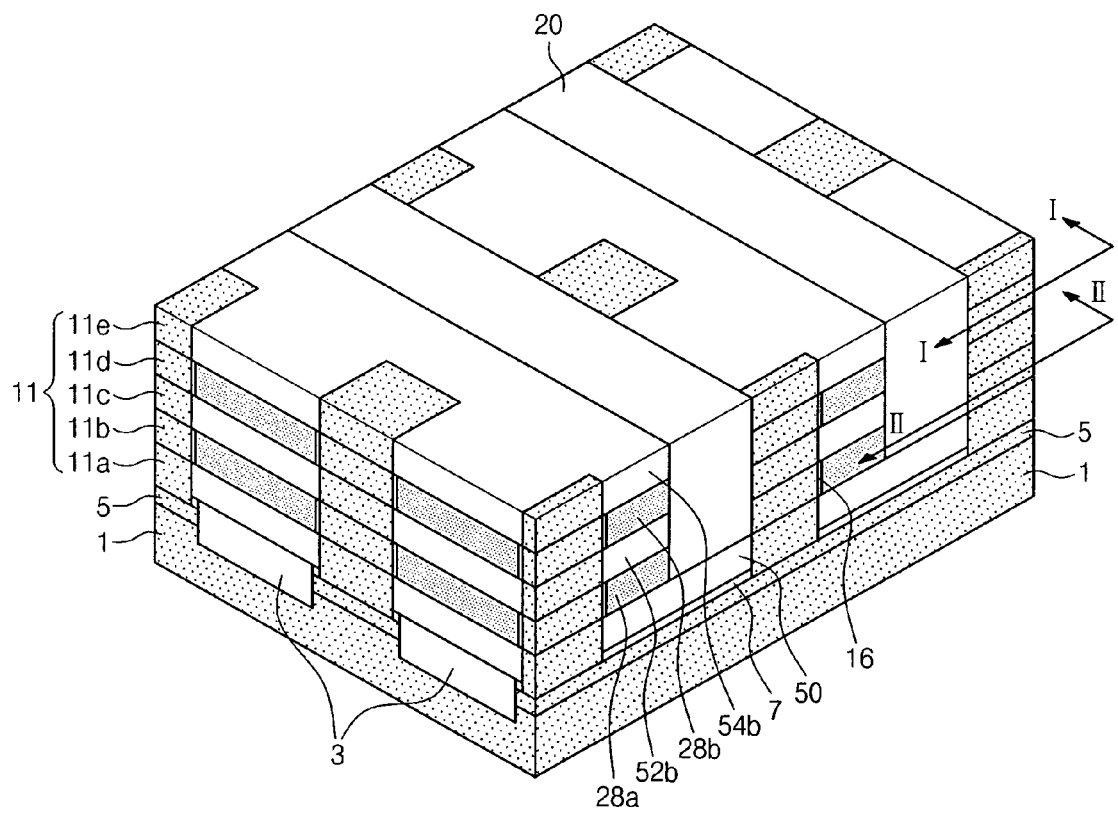
FIG. 15 illustrates a perspective view of a semiconductor memory device in accordance with another example embodiment.
Figure 16:
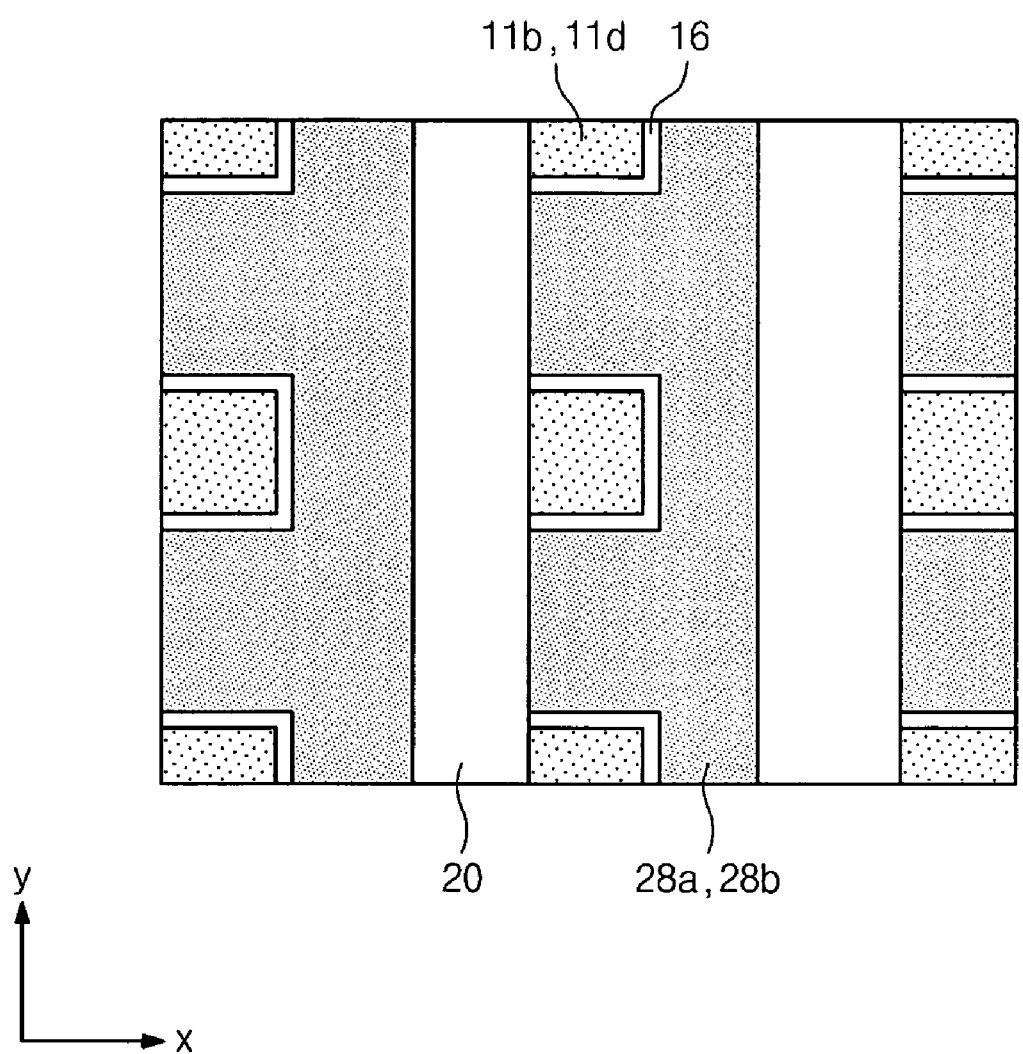
FIG. 16 illustrates a top plan view along line I-I or II-II of FIG. 15.

FIG. 15 illustrates a perspective view of a semiconductor memory device in accordance with another embodiment. FIG. 16 illustrates a top plan view along line I-I or II-II of FIG. 15. The second embodiment may be substantially the same as the first embodiment described previously with reference to FIGS. 1-14, with the exception of having the gate electrodes surround three surfaces of the active pillar, as opposed to four surfaces.

In detail, referring to FIGS. 15 and 16, the first and second body regions 11b and 11d may include four successive side surfaces, e.g., defining a pillar with a square cross-section as viewed from top view, and first and second gate electrodes 28a and 28b surrounding three of the four side surfaces. In other words, the first and second gate electrodes 28a and 28b may have a comb shape running in the second direction y, i.e., a linear structure along the y direction with protrusions along the x direction that are spaced apart along the y direction, and adjacent to, i.e., surrounding, three side surfaces of the first and second body regions 11b and 11d. A side surface of the active pillar 11 that is not adjacent to the first and second gate electrodes 28a and 28b, i.e., a side surface not overlapping the gate electrodes 28a and 28b, may be in contact with the insulating line 20. The first and second gate electrodes 28a and 28b may have a tri-gate shape or an omega shape when viewed from only a portion which is in contact with the body regions 11b and 11d. The third insulating layer pattern 54b and the second insulating layer pattern 52b may have a shape similar to the gate electrodes 28a and 28b. Constructions of the semiconductor memory device in FIG. 15, except features described above, may be substantially the same as the semiconductor memory device of FIG. 1.

In a semiconductor memory device in accordance with the present embodiment, when a unit memory cell operates, an excess hole or an excess electron may not go out of the first body region 11b or the second body region 11d to be temporarily stored in a portion where the first body region 11b or the second body region 11d are adjacent to the insulating line 20. A circuit diagram of a semiconductor memory device in accordance with the second embodiment may be substantially the same as described previously with reference to FIGS. 4-5.

Figure 17:
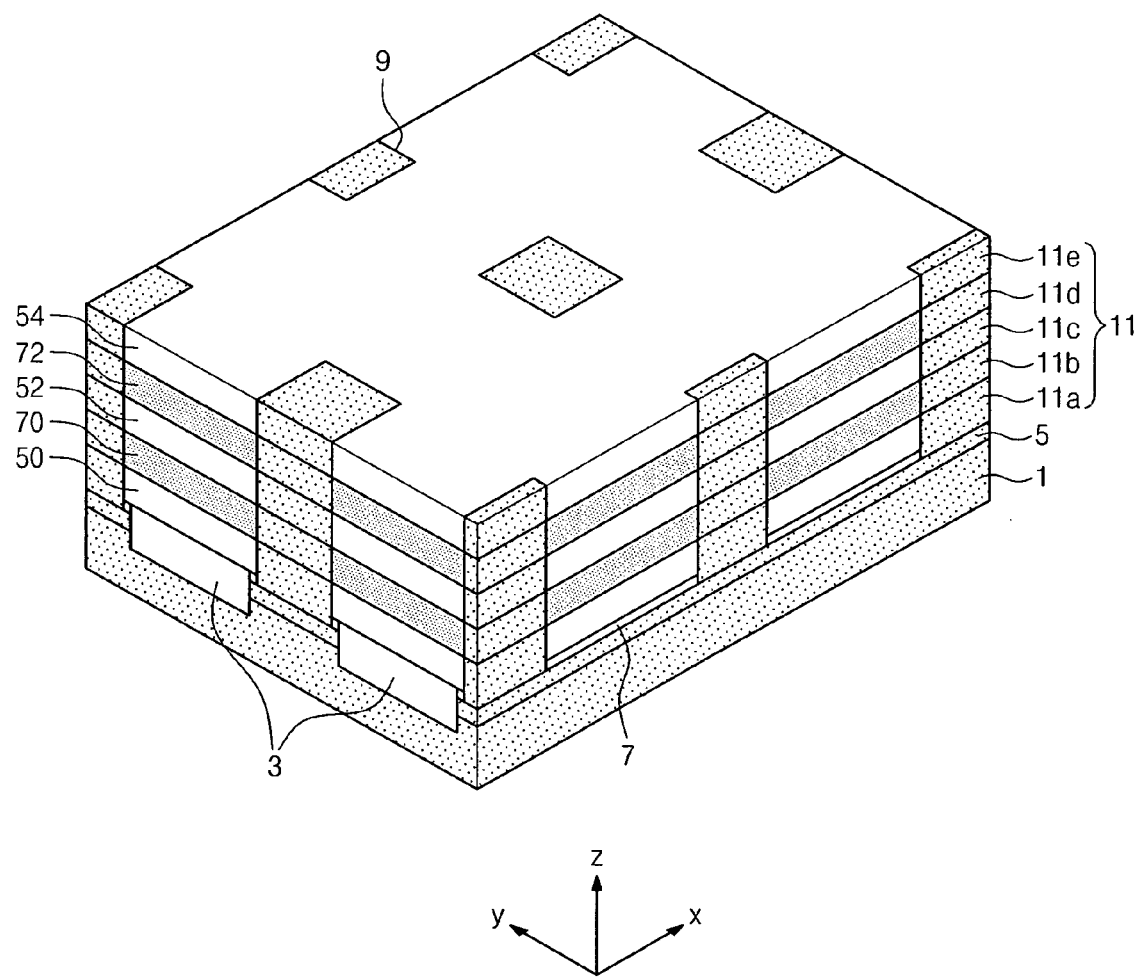
FIGS. 17 through 19 illustrate perspective views of stages in a process of forming the semiconductor memory device of FIG. 15.
Figure 18:
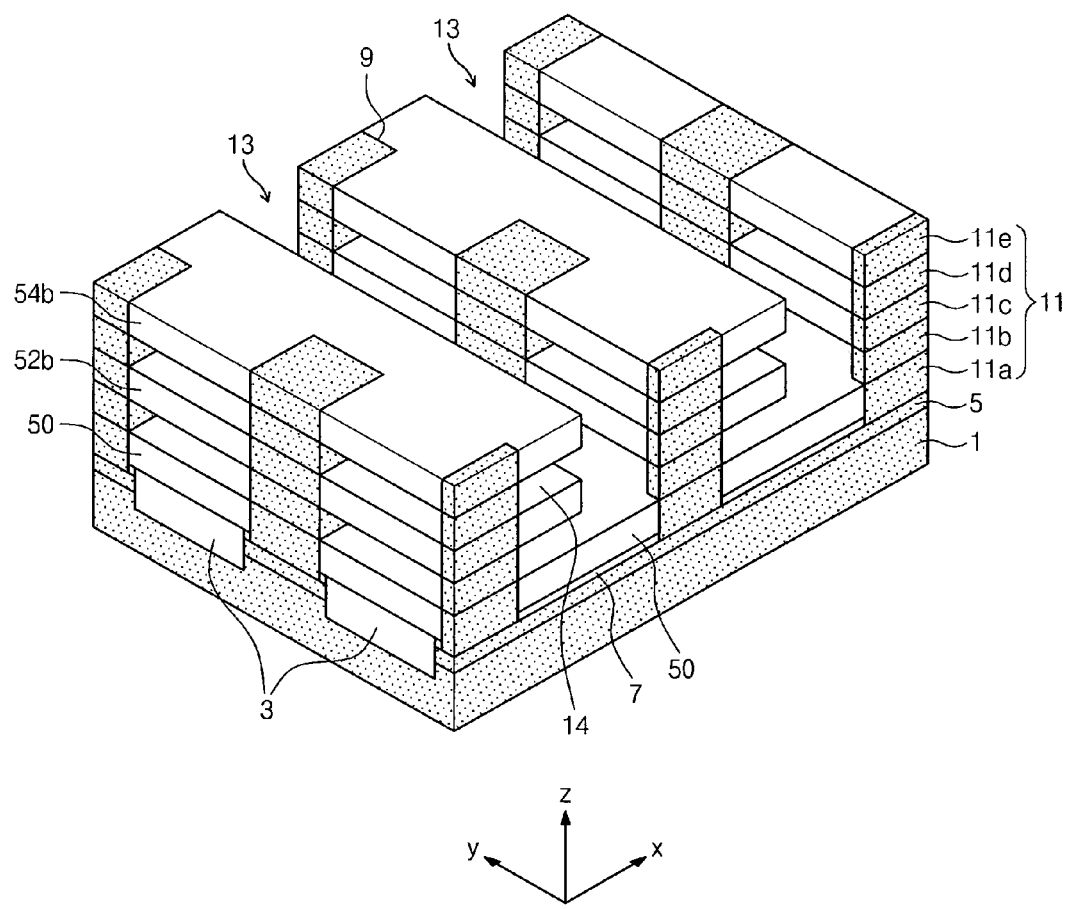
Figure 19:
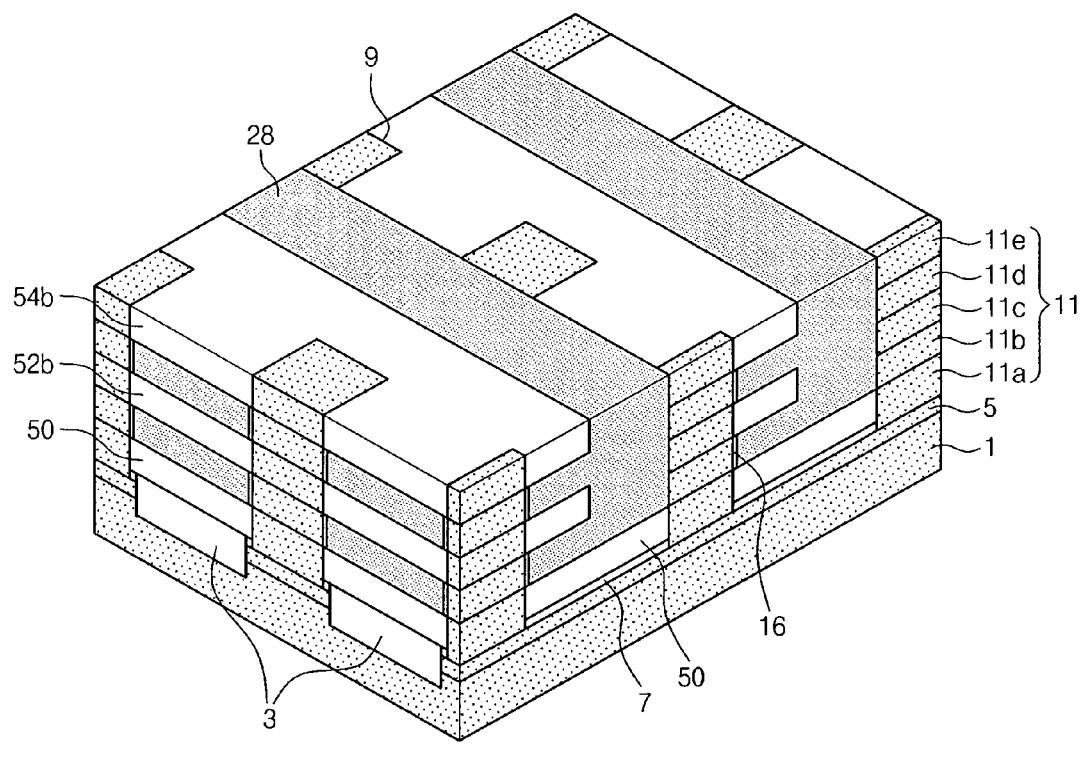

FIGS. 17 through 19 illustrate perspective views of stages in a process of forming the semiconductor memory device of FIG. 15.

Referring to FIG. 17, the device isolation layer 3 and an impurity-doped region 5 may be formed in the semiconductor substrate 1, and insulating layers 7, 50, 52, and 54, as well as sacrificial layers 70 and 72, may be alternately stacked on the semiconductor substrate 1, as described previously with reference to FIG. 7. The insulating layers 7, 50, 52, and 54, as well as the sacrificial layers 70 and 72, may be patterned to form the pillar hole 9 exposing the semiconductor substrate 1. The active pillar 11 may be formed in the pillar hole 9. A formation process of the active pillar 11 may be identical to the process described previously with reference to FIG. 9. The number of the active pillars 11 formed per unit area may be greater than that of FIG. 8. For example, as illustrated in FIG. 17, the semiconductor memory device in accordance with an embodiment may include a plurality of pillars 11 spaced apart from each other along the second direction y and along the x direction.

Referring to FIG. 18, the third insulating layer 54, the second sacrificial layer 72, the second insulating layer 52, and the first sacrificial layer 70 may be etched to have a line shape to form the first groove 13 exposing the first insulating layer 50. At this time, the first groove 13 may be formed to expose one sidewall of the second and third source/drain regions 11c and 11e and the body regions 11b and 11d. The second sacrificial layer 72 and the first sacrificial layer 70 exposed through the first groove 13 may be removed by a selective wet etching process. Sidewalls of the body regions 11b and 11d may be exposed through the exposed region 14 where the second sacrificial layer 72 and the first sacrificial layer 70 are removed.

Referring to FIG. 19, a gate insulating layer 16 may be formed on the exposed sidewall of the body regions 11b and 11d. A gate layer 28 may be formed in the exposed region 14 where the second sacrificial layer 72 and the first sacrificial layer 70 are removed and in the first groove 13.

Referring back to FIG. 15, a gate layer 28 may be patterned at a position superimposed on the first groove 13 to simultaneously form a second groove (not illustrated) exposing the first insulating layer 50 and form gate electrodes 28a and 28b having a comb shape. The insulating line 20 may be formed in the second groove.

Third Embodiment

Figure 20:
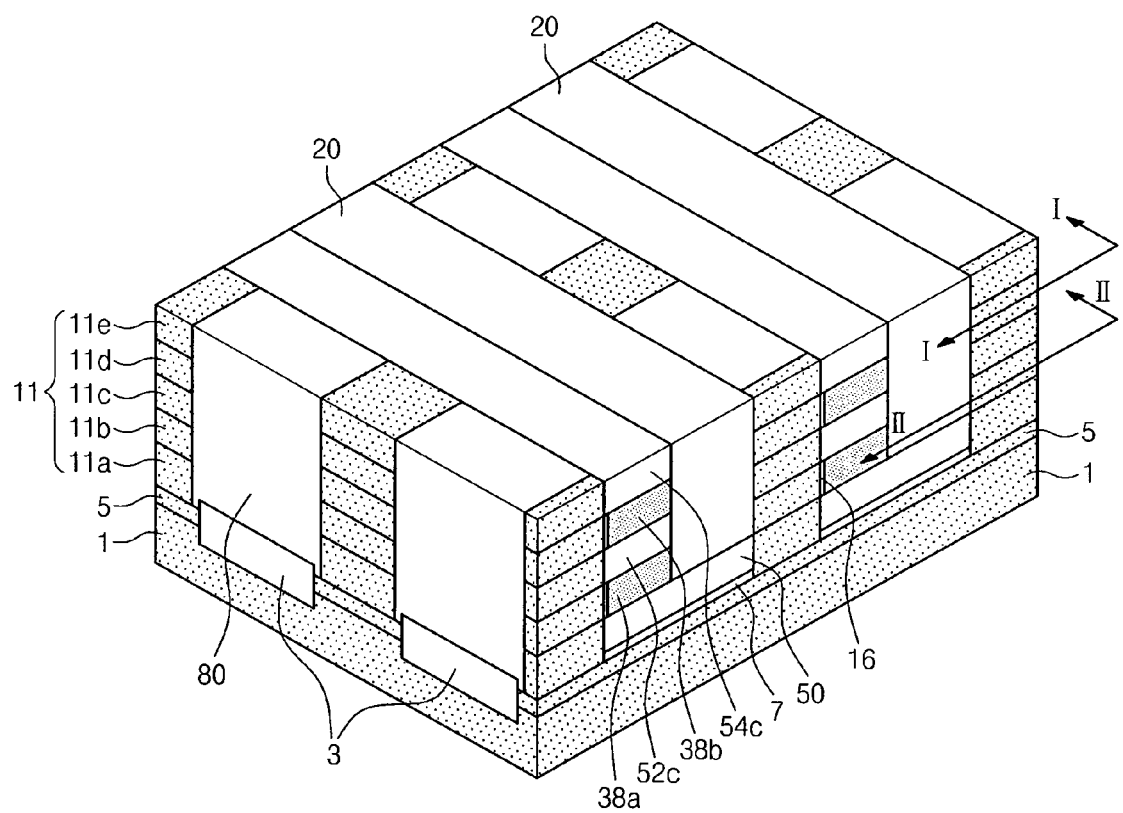
FIG. 20 illustrates a perspective view of a semiconductor memory device in accordance with another example embodiment.
Figure 20:
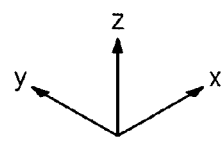
Figure 21:
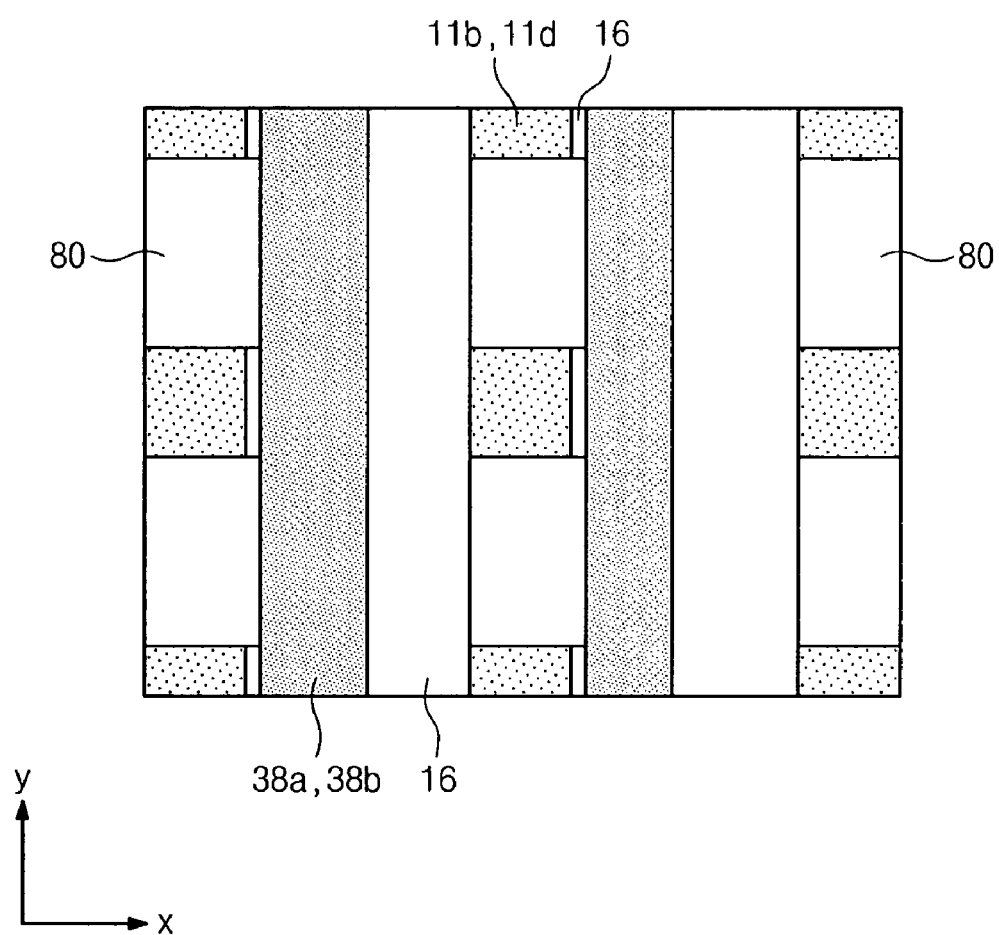
FIG. 21 illustrates a top plan view along line I-I or II-II of FIG. 20.

FIG. 20 illustrates a perspective view of a semiconductor memory device in accordance with another embodiment. FIG. 21 illustrates a top plan view along line I-I or II-II of FIG. 20. The third embodiment may be substantially the same as the first embodiment described previously with reference to FIGS. 1-14, with the exception of having the gate electrodes extend only along one surface of the active pillar with the gate insulating layers therebetween.

Referring to FIGS. 20 and 21, in a semiconductor memory device in accordance with the present embodiment, first and second gate electrodes 38a and 38b may be in contact with, e.g., only, one side surface of the active pillar 11, e.g., via the gate insulating layer 16. For example, each of the first and second gate electrodes 38a and 38b may have a line shape running in the second direction y. An insulating pattern 80 may be disposed between active pillars 11, i.e., between adjacent active pillars arranged along the second direction y. Thus, the first and second gate electrodes 38a and 38b may be disposed between the insulation pattern 80 and the insulating line 20. The third insulating layer pattern 54c and the second insulating layer pattern 52c may have a shape similar to the first and second gate electrodes 38a and 38b. Constructions of the semiconductor memory device in FIG. 21, except features described above, may be substantially the same as the semiconductor memory device of FIG. 15.

In a semiconductor memory device in accordance with the present embodiment, when a unit memory cell operates, an excess hole or an excess electron may not go out of the first body region 11b or the second body region 11d to be temporarily stored in a portion where the first body region 11b or the second body region 11d are adjacent to the insulating line 20. A circuit diagram of a semiconductor memory device in accordance with the third embodiment may be substantially the same as described previously with reference to FIGS. 4-5.

In the semiconductor memory device of FIG. 20, adjacent two first gate electrodes or adjacent two second gate electrodes may be symmetrically disposed with respect to one active pillar to share one body region between the adjacent two first gate electrodes or adjacent two second gate electrodes.

FIGS. 22 through 25 illustrate perspective views of stages in a process of forming the semiconductor memory device of FIG. 20.

Figure 22:
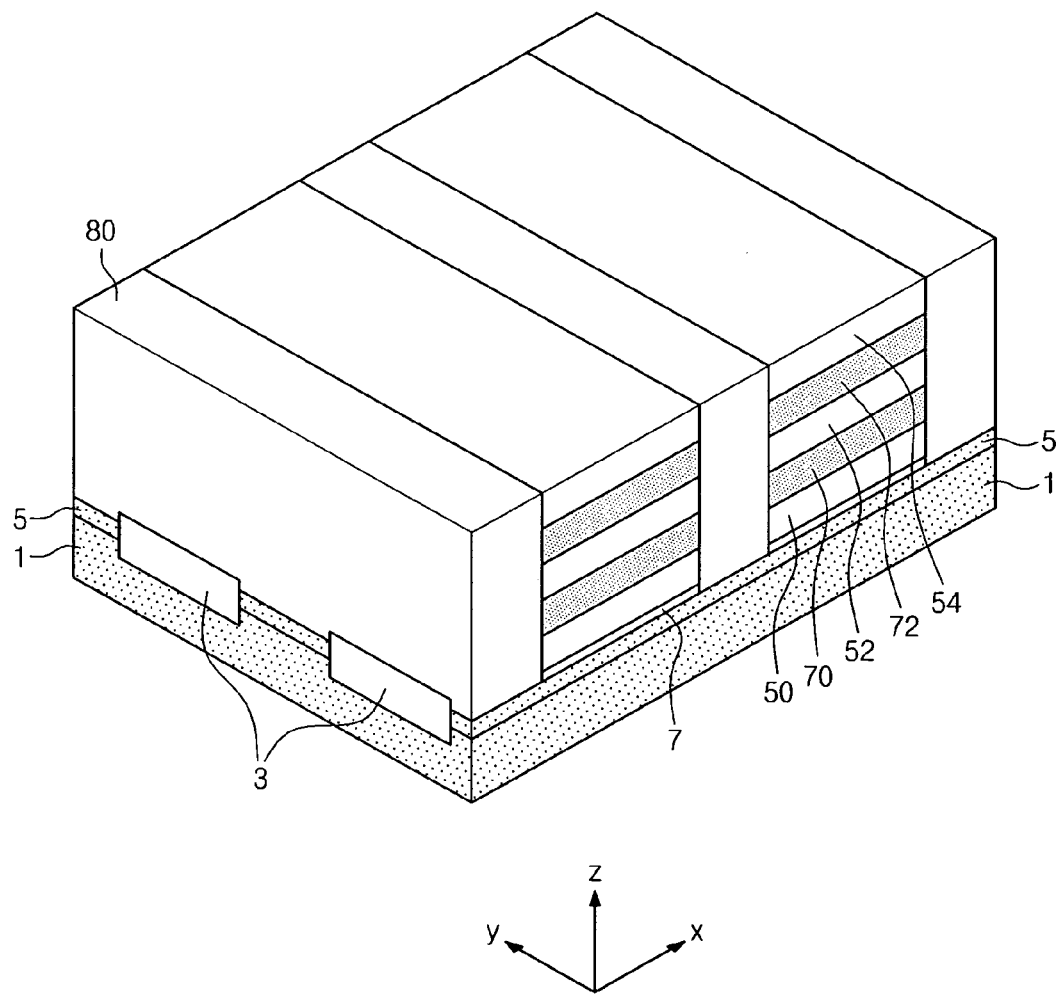
FIGS. 22 through 25 illustrate perspective views of stages in a process of forming the semiconductor memory device of FIG. 20.

Referring to FIG. 22, the device isolation layer 3 and the impurity-doped region 5 may be formed in the semiconductor substrate 1. Insulating layers 7, 50, 52, and 54, as well as sacrificial layers 70 and 72, may be alternately stacked on the semiconductor substrate 1 using the same method as described previously with reference to FIG. 7. The insulating layers 7, 50, 52, and 54, as well as the sacrificial layers 70 and 72, may be patterned to form a groove of a line shape exposing the semiconductor substrate 1. An insulating layer may be formed in the groove, and then may be planarized to form an insulating pattern 80. The insulating pattern 80 may have the same shape as the insulating line 20 subsequently to be formed but may be formed at a different position.

Figure 23:
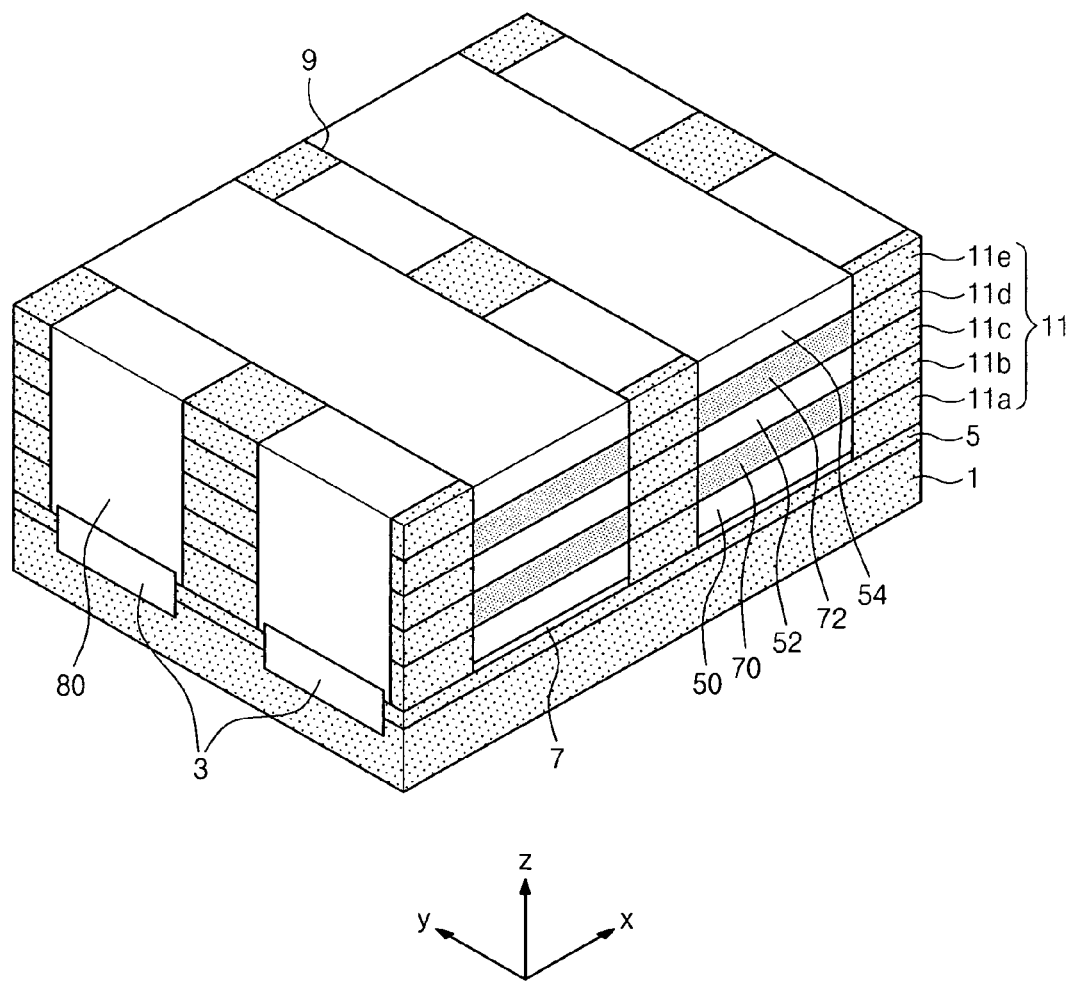

Referring to FIG. 23, the insulating pattern 80 may be patterned to form the pillar hole 9 exposing the semiconductor substrate 1. The active pillar 11 including first, second, and third source/drain regions 11a, 11c, and 11e, as well as first and second body regions 11b and 11d, may be formed in the pillar hole 9.

Figure 24:
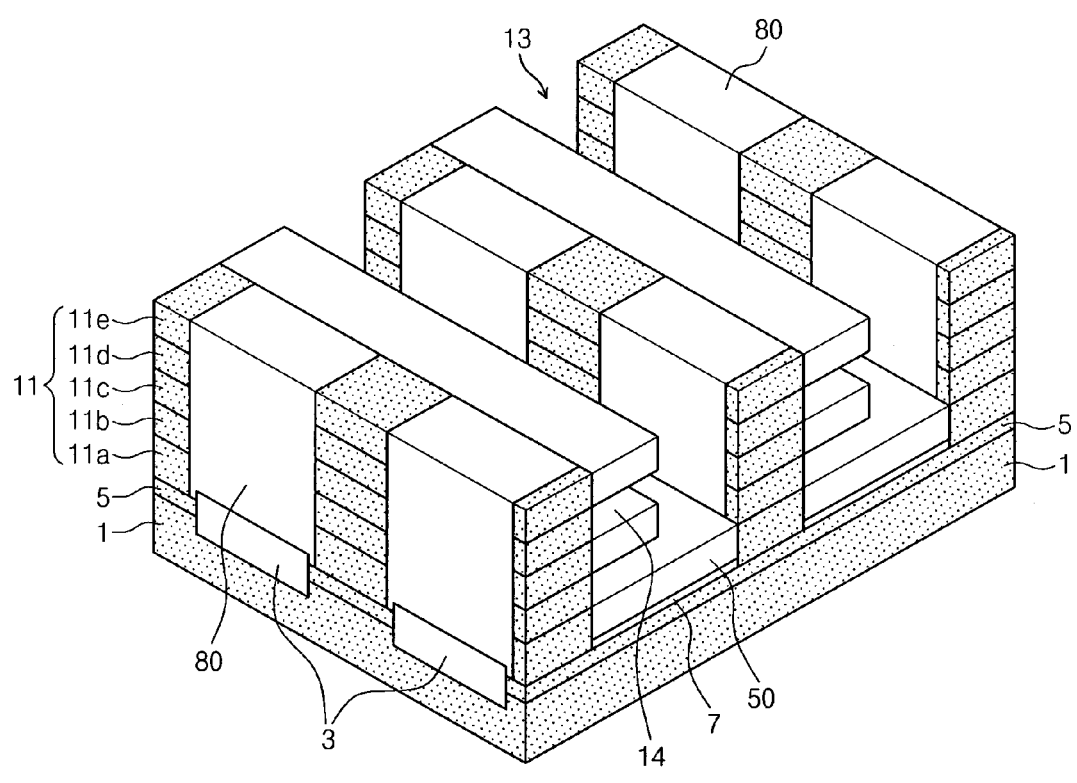

Referring to FIG. 24, the third insulating layer 54, the second sacrificial layer 72, the second insulating layer 52, and the first sacrificial layer 70 may be etched to have a line shape to form the first groove 13 exposing the first insulating layer 50. At this time, the first groove 13 may be formed to expose one sidewall of the second and third source/drain regions 11c and 11e and the first and second body regions 11b and 11d. The second sacrificial layer 72 and the first sacrificial layer 70 exposed through the first groove 13 may be removed by a selective wet etching process. Sidewalls of the first and second body regions 11b and 11d may be exposed through the exposed region 14, where the second sacrificial layer 72 and the first sacrificial layer 70 are removed.

Figure 25:
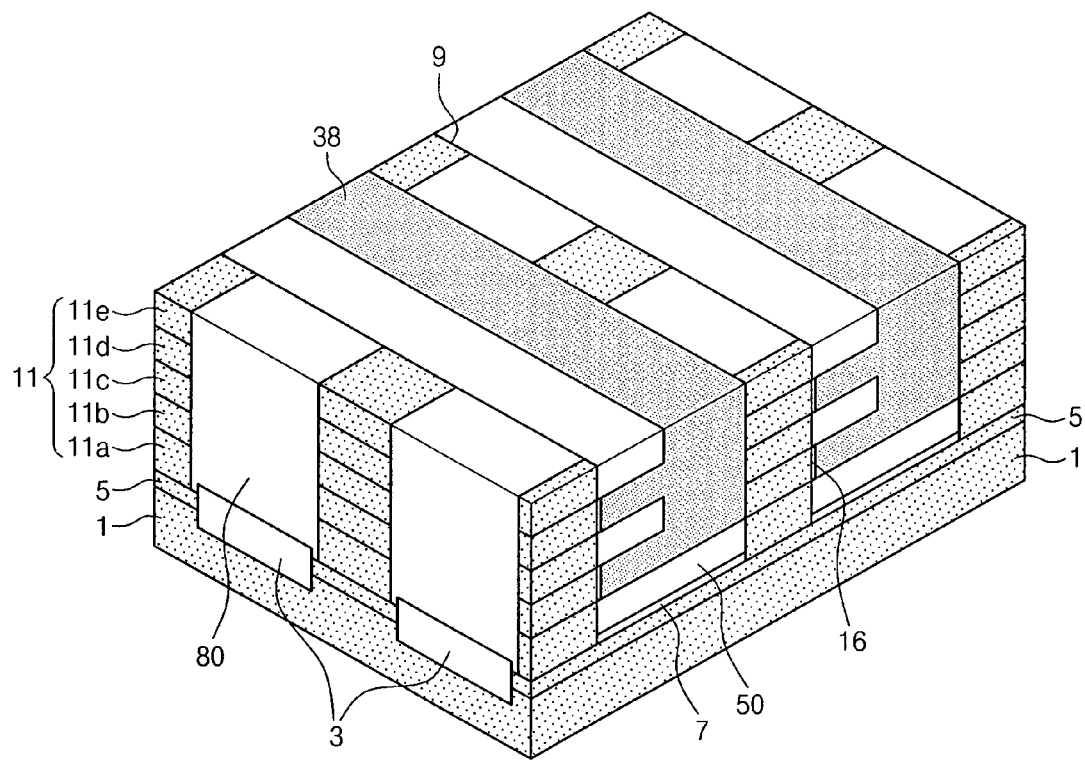

Referring to FIG. 25, the gate insulating layer 16 may be formed on the exposed sidewall of the body regions 11b and 11d. A gate layer 38 may be formed in the region 14 where the second sacrificial layer 72 and the first sacrificial layer 70 may be removed and in the first groove 13.

Referring back to FIG. 20, the gate layer 38 may be patterned at a position superimposed on the first groove 13 to simultaneously form the second groove (not illustrated) exposing the first insulating layer 50 and form the first and second gate electrodes 38a and 38b having a line shape. The insulating line 20 may be formed in the second groove.

Fourth Embodiment

Figure 26:
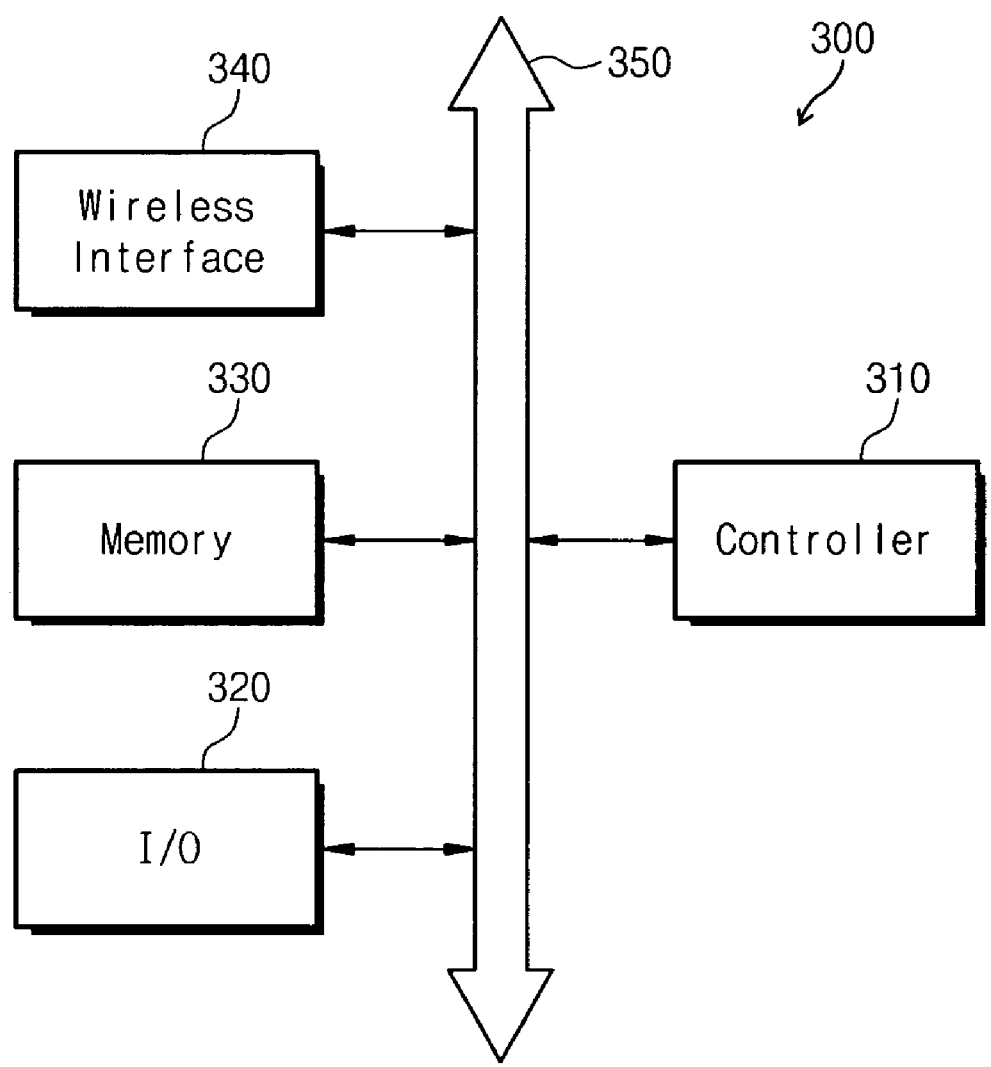
FIG. 26 illustrates a block diagram of an electronic device including a semiconductor memory device in accordance with example embodiments.
Figure 27:
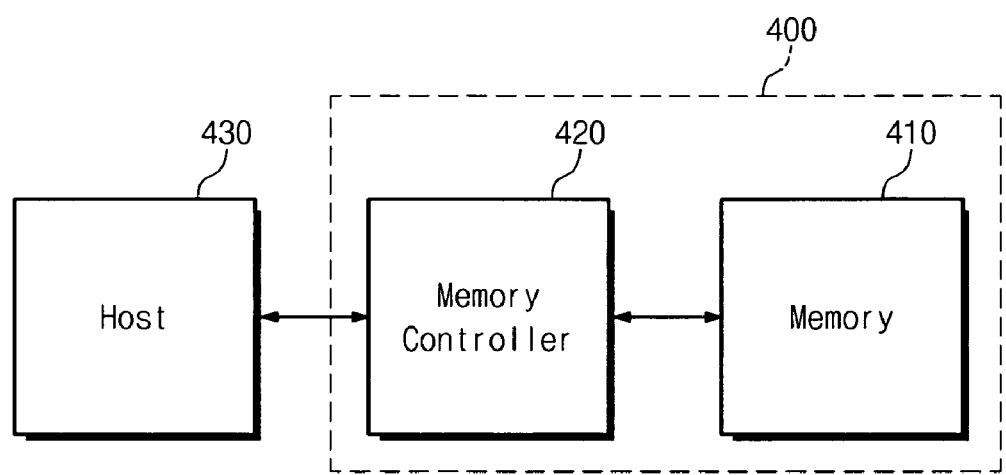
FIG. 27 illustrates a block diagram of a memory system including a semiconductor memory device in accordance with example embodiments.

FIG. 26 illustrates a block diagram of an electronic device including a semiconductor memory device in accordance with an embodiment. FIG. 27 illustrates a block diagram of a memory system including a semiconductor memory device in accordance with an embodiment.

Referring to FIG. 26, an electronic device 300 may include a semiconductor memory device in accordance with an embodiment, e.g., as any one of the semiconductor memory devices described previously with reference to FIGS. 1-25. The electronic device 300 may be used, e.g., in a PDA, a laptop computer, a portable computer, a web tablet, a wireless phone, a cell phone, a digital music player or any other device capable of transmitting and/or receiving data in a wireless environment.

The electronic device 300 may include a controller 310, an input/output (I/O) device 320, e.g., a key pad, a key board, or a display, a memory 330, and a wireless interface 340 that may be connected to each other through a bus 350. The controller 310 may include at least one microprocessor, digital signal processor, microcontroller, etc. The memory 330 may be used to store commands executed by the controller 310. The memory 330 may also be used to store user data. The memory 330 may include the semiconductor memory device in accordance with example embodiments.

The electronic device 300 may use a wireless interface 340 to transmit/receive data to/from a wireless communication network using RF signal. For example, the wireless interface 340 may include an antenna, a wireless transceiver, etc. The electronic device 300 may be used in a communication interface protocol of third generation communication system, e.g., CDMA, GSM, NADC, E-TDMA, WCDMA, and CDMA2000.

Referring to FIG. 27, a memory system 400 may include a semiconductor memory device in accordance with an embodiment, e.g., as any one of the semiconductor memory devices described previously with reference to FIGS. 1-25. The memory system 400 may include a memory device 410 for storing large amounts of data and a memory controller 420. The memory controller 420 controls the memory device 410 to read/write data in/from the memory device 410 in response to a read/write request of a host 430. The memory controller 420 may constitute an address mapping table for mapping an address provided from the host (a mobile device or a computer system) to a physical address. The memory device 410 may include a semiconductor memory device in accordance with an embodiment of the inventive concept.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
a plurality of active pillars protruding from a semiconductor substrate, the plurality of pillars being arranged in a plurality of columns;
a first gate electrode disposed on at least one sidewall of the active pillar, a first gate insulating layer being disposed between the active pillar and the first gate electrode;
a second gate electrode disposed on at least one sidewall of the active pillar over the first gate electrode, a second gate insulating layer being disposed between the active pillar and the second gate electrode;
a first body region in the active pillar adjacent to the first gate electrode;
a second body region in the active pillar adjacent to the second gate electrode;
a first source/drain region in the active pillar between the first body region and the semiconductor substrate;
a second source/drain region in the active pillar between the second body region and the first body region;
a third source/drain region in the active pillar, the second body region being between the second and third source/drain regions; and
an insulating line having flat faces contacting the first gate electrode and the second gate electrode, the insulating line extending continuously between adjacent columns of the active pillars.

2. The semiconductor memory device as claimed in claim 1, wherein each of the first gate electrode and the second gate electrode at least partially surrounds the active pillars, the first and second gate electrodes extending in a plane substantially orthogonal to the sidewall of the active pillar.

3. The semiconductor memory device as claimed in claim 2, wherein each of the first and second gate electrodes continuously overlaps an entire perimeter of each active pillar.

4. The semiconductor memory device as claimed in claim 2, wherein each of the first and second gate electrodes has a comb shape continuously overlapping only a portion of a perimeter of each active pillar, a portion of each of the first and second gate electrodes extending between two adjacent active pillars.

5. The semiconductor memory device as claimed in claim 1, wherein the active pillars are configured to have charges accumulated in the first body regions or in the second body regions.

6. The semiconductor memory device as claimed in claim 1, further comprising:
  a device isolation layer of a line shape in the semiconductor substrate, a longitudinal direction of the device isolation layer being substantially perpendicular to longitudinal directions of the first and second gate electrodes; and
  an impurity-doped region formed in the semiconductor substrate adjacent to the device isolation layer,
  wherein the active pillar is on the impurity-doped region, and the impurity-doped region is doped with an impurity having the same conductivity type as the first source/drain region.

7. The semiconductor memory device as claimed in claim 1, wherein each of the first and second gate electrodes surrounds more than half a perimeter of respective active pillars, the first and second gate electrodes overlapping each other and are separated from each other by an insulator along a vertical direction.

8. The semiconductor memory device as claimed in claim 7, wherein each of the active pillars includes at least four sidewalls, each of the first and second gate electrodes surrounding at least three sidewalls of respective active pillars, and the first and second gate electrodes surrounding respective first and second body regions in the active pillars.

9. The semiconductor memory device as claimed in claim 1, wherein each of the first and second gate electrodes extends continuously along a corresponding column of active pillars and surrounds each of the active pillars in the corresponding column.

10. The semiconductor memory device as claimed in claim 1, wherein the first gate insulating layer extends only between the first body region and the first gate electrode, and the second gate insulating layer extends only between the second body region and the second gate electrode.

11. The semiconductor memory device as claimed in claim 1, wherein the plurality of active pillars and the semiconductor substrate are non-integral, the active pillars and semiconductor substrate having a same crystallization orientation.

12. The semiconductor memory device as claimed in claim 1, wherein top and bottom surfaces the first gate electrode are substantially level with top and bottom surfaces of the first body region, respectively, top and bottom surfaces the second gate electrode are substantially level with top and bottom surfaces of the second body region, respectively, and the top surfaces of the first gate electrode, second gate electrode, first body region, and second body region face away from the semiconductor substrate.

13. The semiconductor memory device as claimed in claim 1, wherein the insulating line is directly between two adjacent first gate electrodes of corresponding active pillars, each first gate electrode contacting the insulating line and a corresponding first gate insulating layer.

14. The semiconductor memory device as claimed in claim 1, wherein the first gate electrode is directly adjacent to the second gate electrode, no charge storage layer being disposed between the first gate electrode and the active pillar, and no charge storage layer being disposed between the second gate electrode and the active pillar.

* * * * *